United States Patent
Seefeldt

(10) Patent No.: US 8,488,809 B2
(45) Date of Patent: *Jul. 16, 2013

(54) CALCULATING AND ADJUSTING THE PERCEIVED LOUDNESS AND/OR THE PERCEIVED SPECTRAL BALANCE OF AN AUDIO SIGNAL

(75) Inventor: Alan Jeffrey Seefeldt, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/338,126

(22) Filed: Dec. 27, 2011

(65) Prior Publication Data

US 2012/0163629 A1 Jun. 28, 2012

Related U.S. Application Data

(63) Continuation of application No. 11/666,252, filed as application No. PCT/US2005/038579 on Oct. 25, 2005, now Pat. No. 8,090,120.

(60) Provisional application No. 60/638,607, filed on Dec. 21, 2004, provisional application No. 60/622,458, filed on Oct. 26, 2004.

(51) Int. Cl.
*H03G 3/00* (2006.01)

(52) U.S. Cl.
USPC .............................. 381/104; 381/107; 381/106

(58) Field of Classification Search
USPC ................... 381/98, 107, 109, 102–104, 106
See application file for complete search history.

(56) References Cited

U.S. PATENT DOCUMENTS

| | | | |
|---|---|---|---|
| 2,808,475 A | 10/1957 | Stryker | |
| 4,281,218 A | 7/1981 | Chuang et al. | |
| 4,543,537 A | 9/1985 | Kuhn et al. | |
| 4,739,514 A | 4/1988 | Short et al. | |

(Continued)

FOREIGN PATENT DOCUMENTS

| | | |
|---|---|---|
| DE | 43 35 739 A1 | 5/1994 |
| DE | 43 35 739 | 5/1995 |

(Continued)

OTHER PUBLICATIONS

European Patent Office Searching Authority International Search Report for International Application No. PCT/US2005/038579 mailed Mar. 1, 2006, 3 pages, Rijswijk Netherlands. (located at end of published application).

(Continued)

*Primary Examiner* — Xu Mei
(74) *Attorney, Agent, or Firm* — Hickman Palermo Truong Becker Bingham Wong LLP; Kirk D. Wong

(57) ABSTRACT

The invention relates to the measurement and control of the perceived sound loudness and/or the perceived spectral balance of an audio signal. An audio signal is modified in response to calculations performed at least in part in the perceptual (psychoacoustic) loudness domain. The invention is useful, for example, in one or more of: loudness-compensating volume control, automatic gain control, dynamic range control (including, for example, limiters, compressors, expanders, etc.), dynamic equalization, and compensating for background noise interference in an audio playback environment. The invention includes not only methods but also corresponding computer programs and apparatus.

18 Claims, 13 Drawing Sheets

U.S. PATENT DOCUMENTS

| | | |
|---|---|---|
| 4,887,299 A | 12/1989 | Cummins et al. |
| 5,027,410 A | 6/1991 | Williamson et al. |
| 5,097,510 A | 3/1992 | Graupe |
| 5,172,358 A | 12/1992 | Kimura |
| 5,263,188 A | 11/1993 | Sanders |
| 5,278,912 A | 1/1994 | Waldhauer |
| 5,363,147 A | 11/1994 | Joseph et al. |
| 5,369,711 A | 11/1994 | Williamson |
| 5,377,277 A | 12/1994 | Bisping |
| RE34,961 E | 6/1995 | Widin et al. |
| 5,457,769 A | 10/1995 | Valley |
| 5,500,902 A | 3/1996 | Stockham, Jr. et al. |
| 5,530,760 A | 6/1996 | Paisley |
| 5,548,638 A | 8/1996 | Yamaguchi et al. |
| 5,583,962 A | 12/1996 | Davis et al. |
| 5,615,270 A | 3/1997 | Miller et al. |
| 5,632,005 A | 5/1997 | Davis et al. |
| 5,633,981 A | 5/1997 | Davis |
| 5,649,060 A | 7/1997 | Ellozy et al. |
| 5,663,727 A | 9/1997 | Vokac |
| 5,682,463 A | 10/1997 | Allen |
| 5,712,954 A | 1/1998 | Dezonno |
| 5,724,433 A | 3/1998 | Engebretson et al. |
| 5,727,119 A | 3/1998 | Davidson et al. |
| 5,819,247 A | 10/1998 | Freund et al. |
| 5,848,171 A | 12/1998 | Stockham, Jr. et al. |
| 5,862,228 A | 1/1999 | Davis |
| 5,878,391 A | 3/1999 | Aarts |
| 5,907,622 A | 5/1999 | Dougherty |
| 5,909,664 A | 6/1999 | Davis et al. |
| 6,002,776 A | 12/1999 | Bhadkamkar et al. |
| 6,002,966 A | 12/1999 | Loeb et al. |
| 6,021,386 A | 2/2000 | Davis et al. |
| 6,041,295 A | 3/2000 | Hinderks |
| 6,061,647 A | 5/2000 | Barrett |
| 6,088,461 A | 7/2000 | Lin et al. |
| 6,094,489 A | 7/2000 | Ishige et al. |
| 6,108,431 A | 8/2000 | Bachler |
| 6,125,343 A | 9/2000 | Schuster |
| 6,148,085 A | 11/2000 | Jung |
| 6,182,033 B1 | 1/2001 | Accardi et al. |
| 6,185,309 B1 | 2/2001 | Attias |
| 6,233,554 B1 | 5/2001 | Heimbigner et al. |
| 6,240,388 B1 | 5/2001 | Fukuchi |
| 6,263,371 B1 | 7/2001 | Geagan, III et al. |
| 6,272,360 B1 | 8/2001 | Yamaguchi et al. |
| 6,275,795 B1 | 8/2001 | Tzirkel-Hancock et al. |
| 6,298,139 B1 | 10/2001 | Poulsen et al. |
| 6,301,555 B2 | 10/2001 | Hinderks |
| 6,311,155 B1 | 10/2001 | Vaudrey et al. |
| 6,314,396 B1 | 11/2001 | Monkowski |
| 6,327,366 B1 | 12/2001 | Uvacek et al. |
| 6,332,119 B1 | 12/2001 | Hinderks |
| 6,351,731 B1 | 2/2002 | Anderson et al. |
| 6,351,733 B1 | 2/2002 | Saunders et al. |
| 6,353,671 B1 | 3/2002 | Kandel et al. |
| 6,370,255 B1 | 4/2002 | Schaub et al. |
| 6,411,927 B1 | 6/2002 | Morin et al. |
| 6,430,533 B1 | 8/2002 | Kolluru et al. |
| 6,442,278 B1 | 8/2002 | Vaudrey et al. |
| 6,442,281 B2 | 8/2002 | Sato et al. |
| 6,473,731 B2 | 10/2002 | Hinderks |
| 6,498,855 B1 | 12/2002 | Kokkosoulis et al. |
| 6,529,605 B1 | 3/2003 | Christoph |
| 6,570,991 B1 | 5/2003 | Sheirer |
| 6,625,433 B1 | 9/2003 | Poirier et al. |
| 6,639,989 B1 | 10/2003 | Zacharov et al. |
| 6,650,755 B2 | 11/2003 | Vaudrey et al. |
| 6,651,041 B1 | 11/2003 | Juric |
| 6,700,982 B1 | 3/2004 | Geurts et al. |
| 6,807,525 B1 | 10/2004 | Li et al. |
| 6,823,303 B1 | 11/2004 | Su et al. |
| 6,889,186 B1 | 5/2005 | Michaelis |
| 6,985,594 B1 | 1/2006 | Vaudrey et al. |
| 7,065,498 B1 | 6/2006 | Thomas et al. |
| 7,068,723 B2 | 6/2006 | Foote et al. |
| 7,155,385 B2 | 12/2006 | Beresteky et al. |
| 7,171,272 B2 | 1/2007 | Blarney et al. |
| 7,212,640 B2 | 5/2007 | Bizjak |
| 7,242,784 B2 | 7/2007 | Cranfill et al. |
| 7,454,331 B2 | 11/2008 | Vinton |
| 7,551,745 B2 | 6/2009 | Gundry et al. |
| 8,090,120 B2 * | 1/2012 | Seefeldt .................. 381/104 |
| 8,199,933 B2 * | 6/2012 | Seefeldt .................. 381/104 |
| 2001/0027393 A1 | 10/2001 | Touimi et al. |
| 2001/0038643 A1 | 11/2001 | McParland |
| 2002/0013698 A1 | 1/2002 | Vaudrey et al. |
| 2002/0040295 A1 | 4/2002 | Saunders et al. |
| 2002/0076072 A1 | 6/2002 | Cornelisse |
| 2002/0097882 A1 | 7/2002 | Greenberg et al. |
| 2002/0146137 A1 | 10/2002 | Kuhnel et al. |
| 2002/0147595 A1 | 10/2002 | Baumgarte |
| 2003/0002683 A1 | 1/2003 | Vaudrey et al. |
| 2003/0035549 A1 | 2/2003 | Bizjak et al. |
| 2004/0024591 A1 | 2/2004 | Boillot et al. |
| 2004/0037421 A1 | 2/2004 | Truman |
| 2004/0042617 A1 | 3/2004 | Beerends et al. |
| 2004/0044525 A1 | 3/2004 | Vinton et al. |
| 2004/0076302 A1 | 4/2004 | Christoph |
| 2004/0122662 A1 | 6/2004 | Crockett |
| 2004/0148159 A1 | 7/2004 | Crockett et al. |
| 2004/0165730 A1 | 8/2004 | Crockett |
| 2004/0172240 A1 | 9/2004 | Crockett et al. |
| 2004/0184537 A1 | 9/2004 | Geiger et al. |
| 2004/0190740 A1 | 9/2004 | Chalupper et al. |
| 2004/0213420 A1 | 10/2004 | Gundry |
| 2006/0002572 A1 | 1/2006 | Smithers et al. |
| 2006/0215852 A1 | 9/2006 | Troxel |
| 2007/0121966 A1 | 5/2007 | Plastina et al. |
| 2007/0291959 A1 | 12/2007 | Seefeldt |
| 2009/0116664 A1 | 5/2009 | Smirnov et al. |

FOREIGN PATENT DOCUMENTS

| | | |
|---|---|---|
| DE | 198 48 491 | 4/2000 |
| EP | 0 517 233 | 12/1992 |
| EP | 0 637 011 | 2/1995 |
| EP | 0 661 905 | 5/1995 |
| EP | 0 746 116 | 12/1996 |
| EP | 1 239 269 | 9/2002 |
| EP | 1 251 715 | 10/2002 |
| EP | 1366564 | 12/2003 |
| EP | 1 387 487 | 4/2004 |
| EP | 1 736 966 | 7/2007 |
| FR | 2 820 573 | 8/2002 |
| JP | 2002-543703 | 12/2002 |
| JP | 2003-264892 | 9/2003 |
| RU | 2012994 | 5/1994 |
| RU | 2206174 | 6/2003 |
| TW | 380246 | 1/2000 |
| TW | 200404222 A | 3/2004 |
| WO | WO/98/27543 | 6/1998 |
| WO | WO 98/47313 | 10/1998 |
| WO | WO/00/78093 | 12/2000 |
| WO | WO 02/17678 | 2/2002 |
| WO | WO/02/17978 | 2/2002 |
| WO | WO 03015082 | 2/2003 |
| WO | WO 03/090208 | 10/2003 |
| WO | WO 2004/019656 | 3/2004 |
| WO | WO 2004/073178 | 8/2004 |
| WO | WO 2004/111994 | 12/2004 |
| WO | WO 2005/086139 | 9/2005 |
| WO | WO 2005/104360 | 11/2005 |
| WO | WO 2006/006977 | 1/2006 |
| WO | WO 2006/019719 | 2/2006 |
| WO | WO 2006/047600 | 5/2006 |
| WO | WO 2006/113047 | 10/2006 |
| WO | WO/2007/120452 | 10/2007 |
| WO | WO 2007/120453 | 10/2007 |
| WO | WO 2007/123608 | 11/2007 |
| WO | WO/2007/127023 | 11/2007 |
| WO | WO 2008/051347 | 5/2008 |
| WO | WO 2008/057173 | 5/2008 |
| WO | WO/2008/085330 | 7/2008 |
| WO | WO 2008/115445 | 9/2008 |
| WO | WO 2008/156774 | 12/2008 |

OTHER PUBLICATIONS

European Patent Office Searching Authority Written Opinion of the International Searching Authority for International Application No. PCT/US2005/038579 dated Feb. 27, 2006, 5 pages, Rijswijk Netherlands.

International Bureau of WIPO International Preliminary Report on Patentability for International Application No. PCT/US2005/038579 dated May 1, 2007, 6 pages, Geneva Switzerland.

Japan Patent Office Rejection for Japanese Application No. 2007-539070 mailed Oct. 18, 2011, 2 pages.

* cited by examiner

CALCULATING AND ADJUSTING THE PERCEIVED LOUDNESS AND/OR THE PERCEIVED SPECTRAL BALANCE OF AN AUDIO SIGNAL

CROSS-REFERENCE TO RELATED APPLICATIONS; BENEFIT CLAIM

This application claims the benefit as a Continuation of Appln. Under 35 U.S.C. §371, Ser. No. 11/666,252, filed Apr. 25, 2007, which is a National Stage Appln. which claims the benefit of International Appln. No. PCT/US05/38579 filed Oct. 25, 2005, which claims priority to Provisional Appln. No. 60/638,607 filed Dec. 21, 2004, and also claims priority to Provisional Appln. No. 60/622,458 filed Oct. 26, 2004, the entire contents of all of which is hereby incorporated by reference as if fully set forth herein, under 35 U.S.C. §120. The applicant(s) hereby rescind any disclaimer of claim scope in the parent application(s) or the prosecution history thereof and advise the USPTO that the claims in this application may be broader than any claim in the parent application(s).

TECHNICAL FIELD

The invention relates to audio signal processing. More particularly, the invention relates to the measurement and control of the perceived sound loudness and/or the perceived spectral balance of an audio signal. The invention is useful, for example, in one or more of: loudness-compensating volume control, automatic gain control, dynamic range control (including, for example, limiters, compressors, expanders, etc.), dynamic equalization, and compensating for background noise interference in an audio playback environment. The invention includes not only methods but also corresponding computer programs and apparatus.

BACKGROUND ART

There have been many attempts to develop a satisfactory objective method of measuring loudness. Fletcher and Munson determined in 1933 that human hearing is less sensitive at low and high frequencies than at middle (or voice) frequencies. They also found that the relative change in sensitivity decreased as the level of the sound increased. An early loudness meter consisted of a microphone, amplifier, meter and a combination of filters designed to roughly mimic the frequency response of hearing at low, medium and high sound levels.

Even though such devices provided a measurement of the loudness of a single, constant level, isolated tone, measurements of more complex sounds did not match the subjective impressions of loudness very well. Sound level meters of this type have been standardized but are only used for specific tasks, such as the monitoring and control of industrial noise.

In the early 1950s, Zwicker and Stevens, among others, extended the work of Fletcher and Munson in developing a more realistic model of the loudness perception process. Stevens published a method for the "Calculation of the Loudness of Complex Noise" in the Journal of the Acoustical Society of America in 1956, and Zwicker published his "Psychological and Methodical Basis of Loudness" article in Acoustica in 1958. In 1959 Zwicker published a graphical procedure for loudness calculation, as well as several similar articles shortly after. The Stevens and Zwicker methods were standardized as ISO 532, parts A and B (respectively). Both methods involve similar steps.

First, the time-varying distribution of energy along the basilar membrane of the inner ear, referred to as the excitation, is simulated by passing the audio through a bank of band-pass auditory filters with center frequencies spaced uniformly on a critical band rate scale. Each auditory filter is designed to simulate the frequency response at a particular location along the basilar membrane of the inner ear, with the filter's center frequency corresponding to this location. A critical-band width is defined as the bandwidth of one such filter. Measured in units of Hertz, the critical-band width of these auditory filters increases with increasing center frequency. It is therefore useful to define a warped frequency scale such that the critical-band width for all auditory filters measured in this warped scale is constant. Such a warped scale is referred to as the critical band rate scale and is very useful in understanding and simulating a wide range of psychoacoustic phenomena. See, for example, *Psychoacoustics—Facts and Models* by E. Zwicker and H. Fastl, Springer-Verlag, Berlin, 1990. The methods of Stevens and Zwicker utilize a critical band rate scale referred to as the Bark scale, in which the critical-band width is constant below 500 Hz and increases above 500 Hz. More recently, Moore and Glasberg defined a critical band rate scale, which they named the Equivalent Rectangular Bandwidth (ERB) scale (B. C. J. Moore, B. Glasberg, T. Baer, "A Model for the Prediction of Thresholds, Loudness, and Partial Loudness," *Journal of the Audio Engineering Society*, Vol. 45, No. 4, April 1997, pp. 224-240). Through psychoacoustic experiments using notched-noise maskers, Moore and Glasberg demonstrated that the critical-band width continues to decrease below 500 Hz, in contrast to the Bark scale where the critical-band width remains constant.

Following the computation of excitation is a non-linear compressive function that generates a quantity referred to as "specific loudness". Specific loudness is a measure of perceptual loudness as a function of frequency and time and may be measured in units of perceptual loudness per unit frequency along a critical band rate scale, such as the Bark or ERB scale discussed above. Finally, the time-varying "total loudness" is computed by integrating specific loudness across frequency. When specific loudness is estimated from a finite set of auditory filters distributed uniformly along a critical band rate scale, total loudness may be computed by simply summing the specific loudness from each filter.

Loudness may be measured in units of phon. The loudness of a given sound in phon is the sound pressure level (SPL) of a 1 kHz tone having a subjective loudness equal to that of the sound. Conventionally, the reference 0 dB for SPL is a root mean square pressure of $2 \times 10^{-5}$ Pascal, and this is also therefore the reference 0 phon. Using this definition in comparing the loudness of tones at frequencies other than 1 kHz with the loudness at 1 kHz, a contour of equal loudness can be determined for a given phon level. FIG. 11 shows equal loudness contours for frequencies between 20 Hz and 12.5 kHz, and for phon levels between 4.2 phon (considered to be the threshold of hearing) and 120 phon (ISO226: 1087 (E), "Acoustics—Normal equal loudness level contours"). The phon measurement takes into account the varying sensitivity of human hearing with frequency, but the results do not allow the assessment of the relative subjective loudnesses of sounds at varying levels because there is no attempt to correct for the non-linearity of the growth of loudness with SPL, that is, for the fact that the spacing of the contours varies.

Loudness may also be measured in units of "sone". There is a one-to-one mapping between phon units and sone units, as indicated in FIG. 11. One sone is defined as the loudness of a 40 dB (SPL) 1 kHz pure sine wave and is equivalent to 40 phon. The units of sone are such that a twofold increase in sone corresponds to a doubling of perceived loudness. For example, 4 sone is perceived as twice as loud as 2 sone. Thus, expressing loudness levels in sone is more informative. Given the definition of specific loudness as a measure of perceptual loudness as a function of frequency and time, specific loudness may be measured in units of sone per unit frequency. Thus, when using the Bark scale, specific loudness has units of sone per Bark and likewise when using the ERB scale, the units are sone per ERB.

As mentioned above, the sensitivity of the human ear varies with both frequency and level, a fact well documented in the psychoacoustics literature. One of the results is that the perceived spectrum or timbre of a given sound varies with the acoustic level at which the sound is heard. For example, for a sound containing low, middle and high frequencies, the perceived relative proportions of such frequency components change with the overall loudness of the sound; when it is quiet the low and high frequency components sound quieter relative to the middle frequencies than they sound when it is loud. This phenomenon is well known and has been mitigated in sound reproducing equipment by so-called loudness controls. A loudness control is a volume control that applies low- and sometimes also high-frequency boost as the volume is turned down. Thus, the lower sensitivity of the ear at the frequency extremes is compensated by an artificial boost of those frequencies. Such controls are completely passive; the degree of compensation applied is a function of the setting of the volume control or some other user-operated control, not as a function of the content of the audio signals.

In practice, changes in perceived relative spectral balance among low, middle and high frequencies depend on the signal, in particular on its actual spectrum and on whether it is intended to be loud or soft. Consider the recording of a symphony orchestra. Reproduced at the same level that a member of the audience would hear in a concert hall, the balance across the spectrum may be correct whether the orchestra is playing loudly or quietly. If the music is reproduced 10 dB quieter, for example, the perceived balance across the spectrum changes in one manner for loud passages and changes in another manner for quiet passages. A conventional passive loudness control does not apply different compensations as a function of the music.

In International Patent Application No. PCT/US2004/016964, filed May 27, 2004, published Dec. 23, 2004 as WO 2004/111994 A2, Seefeldt et al disclose, among other things, a system for measuring and adjusting the perceived loudness of an audio signal. Said PCT application, which designates the United States, is hereby incorporated by reference in its entirety. In said application, a psychoacoustic model calculates the loudness of an audio signal in perceptual units. In addition, the application introduces techniques for computing a wideband multiplicative gain, which, when applied to the audio, results in the loudness of the gain-modified audio being substantially the same as a reference loudness. Application of such wideband gain, however, changes the perceived spectral balance of the audio.

DISCLOSURE OF THE INVENTION

In one aspect, the invention provides for deriving information usable for controlling the specific loudness of an audio signal by modifying the audio signal in order to reduce the difference between its specific loudness and a target specific loudness. Specific loudness is a measure of perceptual loudness as a function of frequency and time. In practical implementations, the specific loudness of the modified audio signal may be made to approximate the target specific loudness. The approximation may be affected not only by ordinary signal processing considerations but also time- and/or frequency-smoothing that may be employed in the modifying, as described below.

Because specific loudness is a measure of perceptual loudness of an audio signal as a function of frequency and time, in order to reduce the difference between the specific loudness of the audio signal and the target specific loudness, the modifying may modify the audio signal as a function of frequency. Although in some cases the target specific loudness may be time-invariant and the audio signal itself may be a steady-state time-invariant signal, typically, the modifying may also modify the audio signal as a function of time.

Aspects of the present invention may also be employed to compensate for background noise interfering in an audio playback environment. When audio is heard in the presence of background noise, the noise may partially or completely mask the audio in a manner dependent on both the level and spectrum of the audio and the level and spectrum of the noise. The result is an alteration in the perceived spectrum of the audio. In accordance with psychoacoustic studies (see, for example, Moore, Glasberg, and Baer, "A Model for the Prediction of Thresholds, Loudness, and Partial Loudness," *J. Audio Eng. Soc.*, Vol. 45, No. 4, April 1997), one may define the "partial specific loudness" of the audio as the perceptual loudness of the audio in the presence of a secondary interfering sound signal, such as the noise.

Thus, in another aspect, the invention provides for deriving information usable for controlling the partial specific loudness of an audio signal by modifying the audio signal in order to reduce the difference between its partial specific loudness and a target specific loudness. Doing so mitigates the effects of the noise in a perceptually accurate manner. In this and other aspects of the invention that take an interfering noise signal into account, it is assumed that there is access to the audio signal by itself and the secondary interfering signal by itself.

In another aspect, the invention provides for controlling the specific loudness of an audio signal by modifying the audio signal in order to reduce the difference between its specific loudness and a target specific loudness.

In another aspect, the invention provides for controlling the partial specific loudness of an audio signal by modifying the audio signal in order to reduce the difference between its partial specific loudness and a target specific loudness.

When the target specific loudness is not a function of the audio signal, it may be a stored or received target specific loudness. When the target specific loudness is not a function of the audio signal, the modifying or the deriving may explicitly or implicitly calculate specific loudness or partial specific loudness. Examples of implicit calculation include, a lookup table or a "closed-form" mathematical expression, in which specific loudness and/or partial specific loudness is inherently determined (the term closed-form is meant to describe a mathematical expression which can be represented exactly using a finite number of standard mathematical operations and functions, such as exponentiation and cosine). Also when the target specific loudness is not a function of the audio signal, the target specific loudness may be both time- and frequency-invariant or it may be only time-invariant.

In yet another aspect, the invention provides for processing an audio signal by processing the audio signal or a measure of the audio signal in accordance with one or more processes and one or more process-controlling parameters to produce a target specific loudness. Although the target specific loudness may be time-invariant ("fixed"), the target specific loudness may advantageously be a function of the specific loudness of the audio signal. Although it may be a static, frequency- and time-invariant signal, typically, the audio signal itself is frequency- and time-varying, thus causing the target specific loudness to be frequency- and time-varying when it is a function of the audio signal.

The audio and a target specific loudness or a representation of a target specific loudness may be received from a transmission or reproduced from a storage medium.

The representation of a target specific loudness may be one or more scale factors that scale the audio signal or measure of the audio signal.

The target specific loudness of any of the above aspects of the invention may be a function of the audio signal or measure of the audio signal. One suitable measure of the audio signal is the specific loudness of the audio signal. The function of the audio signal or measure of the audio signal may be a scaling of the audio signal or measure of the audio signal. For example, the scaling may be one or a combination of scalings:

(a) a time- and frequency-varying scale factor $\Xi[b,t]$ scaling of the specific loudness as in the relationship $$\hat{N}[b,t]=\Xi[b,t]N[b,t];$$

(b) a time-varying, frequency-invariant scale factor $\Phi[t]$ scaling of the specific loudness as in the relationship $$\hat{N}[b,t]=\Phi[t]N[b,t];$$

(c) a time-invariant, frequency-varying scale factor $\Theta[b]$ scaling of the specific loudness as in the relationship $$\hat{N}[b,t]=\Theta[b]N[b,t]; \text{ and}$$

(d) a time-invariant, frequency-invariant, scale factor $\alpha$ scaling of the specific loudness of the audio signal as in the relationship $$\hat{N}[b,t]=\alpha N[b,t];$$

wherein $\hat{N}[b,t]$ is the target specific loudness, $N[b,t]$ is the specific loudness of the audio signal, b is a measure of frequency, and t is a measure of time.

In the case (a) of a time- and frequency-varying scale factor, the scaling may be determined at least in part by a ratio of a desired multiband loudness and the multiband loudness of the audio signal. Such a scaling may be usable as a dynamic range control. Further details of employing aspects of the invention as a dynamic range control are set forth below.

Also in the case (a) of a time- and frequency-varying scale factor, the specific loudness may scaled by the ratio of a measure of a desired spectral shape to the measure of a spectral shape of the audio signal. Such a scaling may be employed to transform the perceived spectrum of the audio signal from a time-varying perceived spectrum to a substantially time-invariant perceived spectrum. When the specific loudness is scaled by the ratio of a measure of a desired spectral shape to the measure of a spectral shape of the audio signal, such a scaling may be usable as a dynamic equalizer. Further details of employing aspects of the invention as a dynamic equalizer are set forth below.

In the case (b) of a time-varying, frequency-invariant scale factor, the scaling may be determined at least in part by a ratio of a desired wideband loudness and the wideband loudness of the audio signal. Such a scaling may be usable as an automatic gain control or dynamic range control. Further details of employing aspects of the invention as an automatic gain control or a dynamic range control are set forth below In case (a) (a time- and frequency-varying scale factor) or case (b) (a time-varying, frequency-invariant scale factor), the scale factor may be a function of the audio signal or measure of the audio signal.

In both the case (c) of a time-invariant, frequency-varying scale factor or the case (d) of a time-invariant, frequency-invariant, scale factor, the modifying or the deriving may include storing the scale factor or the scale factor may be received from an external source.

In either of cases (c) and (d), the scale factor may not be a function of the audio signal or measure of the audio signal.

In any of the various aspects of the invention and the variations thereof, the modifying, deriving, or producing may, variously, explicitly or implicitly calculate (1) specific loudness, and/or (2) partial specific loudness, and/or (3) the target specific loudness. Implicit calculations may involve, for example, a lookup table or a closed-form mathematical expression.

Modification parameters may be temporally smoothed. Modification parameters may be, for example, (1) a plurality of amplitude scaling factors relating to frequency bands of the audio signal or (2) a plurality of filter coefficients for controlling one or more filters, such as a multitapped FIR filter or a multipole IIR filter. The scaling factors or filter coefficients (and the filters to which they are applied) may be time-varying.

In calculating the function of the specific loudness of the audio signal that defines the target specific loudness or the inverse of that function, the process or processes performing such calculations operates in what may be characterized as the perceptual (psychoacoustic) loudness domain—the input and output of the calculation are specific loudnesses. In contrast, in applying amplitude scaling factors to frequency bands of the audio signal or applying filter coefficients to a controllable filtering of the audio signal, the modification parameters operate to modify the audio signal outside the perceptual (psychoacoustic) loudness domain in what may be characterized as the electrical signal domain. Although modifications to the audio signal may be made to the audio signal in the electrical signal domain, such changes in the electrical signal domain are derived from calculations in the perceptual (psychoacoustic) loudness domain such that the modified audio signal has a specific loudness that approximates the desired target specific loudness.

By deriving modification parameters from calculations in the loudness domain, greater control over perceptual loudness and perceived spectral balance may be achieved than if such modification parameters were derived in the electrical signal domain. In addition, the use of a basilar-membrane simulating psychoacoustic filterbank or its equivalent in performing loudness domain calculations may provide a more detailed control of the perceived spectrum than in arrangements that derive modification parameters in the electrical signal domain.

Each of the modifying, deriving, and producing may be dependent on one or more of a measure of an interfering audio signal, a target specific loudness, an estimate of the specific loudness of the unmodified audio signal derived from the specific loudness or partial specific loudness of the modified audio signal, the specific loudness of the unmodified audio signal, and an approximation to the target specific loudness derived from the specific loudness or partial specific loudness of the modified audio signal.

The modifying or deriving may derive modification parameters at least in part from one or more of a measure of an interfering audio signal, a target specific loudness, an estimate of the specific loudness of the unmodified audio signal derived from the specific loudness or partial specific loudness of the modified audio signal, the specific loudness of the unmodified audio signal, and an approximation to the target specific loudness derived from the specific loudness or partial specific loudness of the modified audio signal.

More particularly, the modifying or deriving may derive modification parameters at least in part from
(1) one of
a target specific loudness, and
an estimate of the specific loudness of the unmodified audio signal received from the specific loudness of the modified audio signal, and
(2) one of
the specific loudness of the unmodified audio signal, and
an approximation to the target specific loudness derived from the specific loudness of the modified audio signal,
or, when an interfering audio signal is to be taken into account, the modifying or deriving may derive modification parameters at least in part from
(1) a measure of an interfering audio signal,
(2) one of
a target specific loudness, and
an estimate of the specific loudness of the unmodified audio signal derived from the partial specific loudness of the modified audio signal, and
(3) one of
the specific loudness of the unmodified audio signal, and
an approximation to the target specific loudness derived from the partial specific loudness of the modified audio signal.

A feed-forward arrangement may be employed in which the specific loudness is derived from the audio signal and wherein the target specific loudness is received from a source external to the method or from a storing when the modifying or deriving includes storing a target specific loudness. Alternatively, a hybrid feed-forward/feedback arrangement may be employed in which an approximation to the target specific loudness is derived from the modified audio signal and wherein the target specific loudness is received from a source external to the method or from a storing when the modifying or deriving includes storing a target specific loudness.

The modifying or deriving may include one or more processes for obtaining, explicitly or implicitly, the target specific loudness, one or ones of which calculates, explicitly or implicitly, a function of the audio signal or measure of the audio signal. In one alternative, a feed-forward arrangement may be employed in which the specific loudness and the target specific loudness are derived from the audio signal, the derivation of the target specific loudness employing a function of the audio signal or measure of the audio signal. In another alternative, a hybrid feed-forward/feedback arrangement may be employed in which an approximation to the target specific loudness is derived from the modified audio signal and the target specific loudness is derived from the audio signal, the derivation of the target specific loudness employing a function of the audio signal or measure of the audio signal.

The modifying or deriving may include one or more processes for obtaining, explicitly or implicitly, an estimate of the specific loudness of the unmodified audio signal in response to the modified audio signal, one or ones of which calculates, explicitly or implicitly, the inverse of a function of the audio signal or measure of the audio signal. In one alternative, a feedback arrangement is employed in which an estimate of the specific loudness of the unmodified audio signal and an approximation to the target specific loudness are derived from the modified audio signal, the estimate of the specific loudness being calculated using the inverse of a function of the audio signal or measure of the audio signal. In another alternative, a hybrid feed-forward/feedback arrangement is employed in which the specific loudness is derived from the audio signal and the estimate of the specific loudness of the unmodified audio signal is derived from the modified audio signal, the derivation of the estimate being calculated using the inverse of said function of the audio signal or measure of the audio signal.

Modification parameters may be applied to the audio signal to produce a modified audio signal.

Another aspect of the invention is that there may be a temporal and/or spatial separation of processes or devices so that there is, in effect, an encoder or encoding and also a decoder or decoding. For example, there may be an encoding/decoding system in which the modifying or deriving may either transmit and receive or store and also reproduce the audio signal and either (1) modification parameters or (2) a target specific loudness or a representation of a target specific loudness. Alternatively, there may be, in effect, only an encoder or encoding in which there is either a transmitting or storing of the audio signal and (1) modification parameters or (2) a target specific loudness or representation of target specific loudness. Alternatively, as mentioned above, there may be, in effect, only a decoder or decoding in which there is a reception and reproduction of the audio signal and (1) modification parameters or (2) a target specific loudness or representation of target specific loudness.

BEST MODE FOR CARRYING OUT THE INVENTION

FIGS. 1 through 4 show functional block diagrams illustrating possible feed-forward, feedback, and two versions of hybrid feed-forward/feedback implementation examples according to aspects of the invention.

Figure 1:
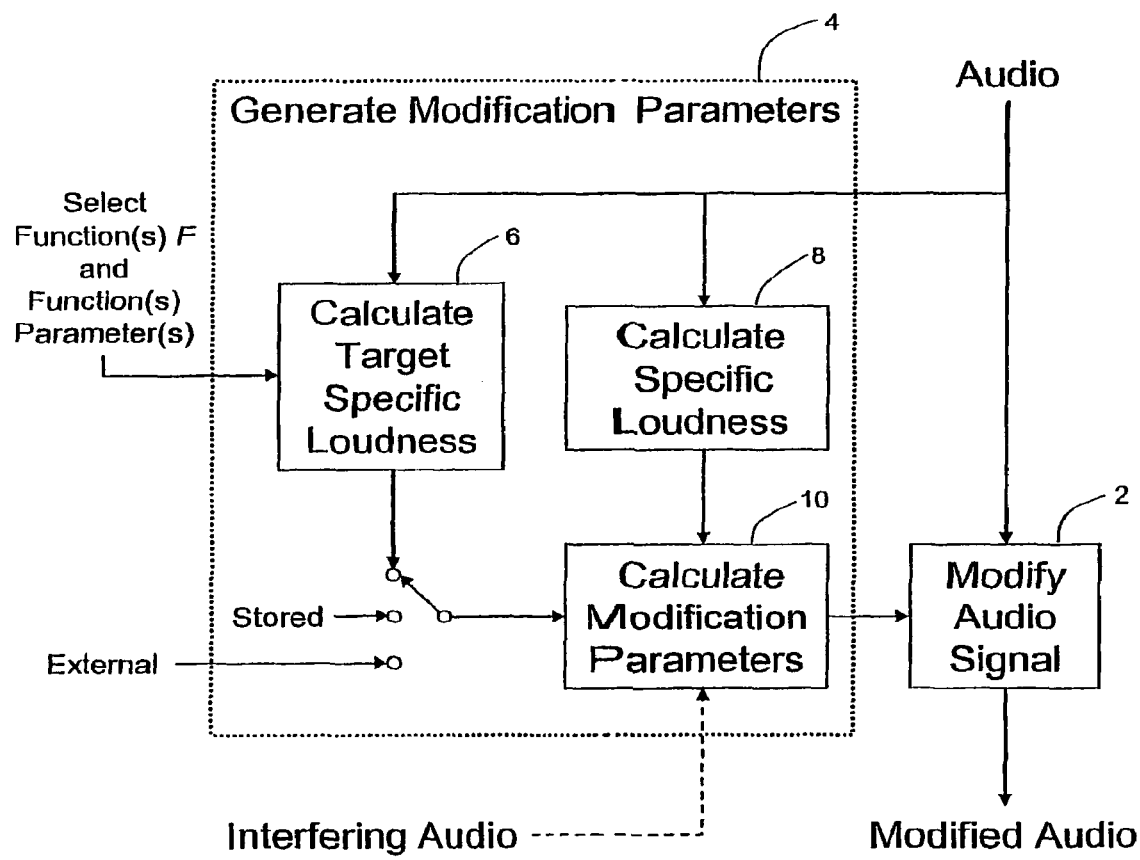
FIG. 1 is a functional block diagram illustrating an example of a feed-forward implementation according to aspects of the invention.

Referring to the example of a feed-forward topology in FIG. 1, an audio signal is applied to two paths: (1) a signal path having a process or device 2 ("Modify Audio Signal") capable of modifying the audio in response to modification parameters, and (2) a control path having a process or device 4 ("Generate Modification Parameters") capable of generating such modification parameters. The Modify Audio Signal 2 in the FIG. 1 feed-forward topology example and in each of the FIGS. 2-4 examples may be a device or process that modifies the audio signal, for example, its amplitude, in a frequency- and/or time-varying manner in accordance with modification parameters M received from the Generate Modification Parameters 4 (or from counterpart processes or devices 4', 4" and 4''' in each of the FIGS. 2-4 examples, respectively). The Generate Modification Parameters 4 and its counterparts in FIGS. 2-4 each operate at least partly in the perceptual loudness domain. The Modify Audio Signal 2 operates in the electrical signal domain and produces a modified audio signal in each of the FIG. 1-4 examples. Also in each of the FIG. 1-4 examples, the Modify Audio Signal 2 and the Generate Modification Parameters 4 (or its counterparts) modify the audio signal to reduce the difference between its specific loudness and a target specific loudness.

In the FIG. 1 feed-forward example, process or device 4 may include several processes and/or devices: a "Calculate Target Specific Loudness" process or device 6 that calculates a target specific loudness in response to the audio signal or a measure of the audio signal such as the specific loudness of the audio signal, a "Calculate Specific Loudness" process or device 8 that calculates the specific loudness of the audio signal in response to the audio signal or a measure of the audio signals such as its excitation, and a "Calculate Modification Parameters" process or device 10 that calculates the modification parameters in response to the specific loudness and the target specific loudness. The Calculate Target Specific Loudness 6 may perform one or more functions "F", each of which may have function parameters. For example, it may calculate the specific loudness of the audio signal and then apply one or more functions F to it to provide a target specific loudness. This is indicated schematically in FIG. 1 as a "Select Function(s) F and Function(s) Parameter(s)" input to process or device 6. Instead of being calculated by device or process 6, the target specific loudness may be provided by a storing process or device (shown schematically as a "Stored" input to process or device 10) included in or associated with the Generate Modification Parameters 4, or by a source external to the overall process or device (shown schematically as the "External" input to process or device 10). Thus, the modification parameters are based at least in part on calculations in the perceptual (psychoacoustic) loudness domain (i.e., at least the specific loudness and, in some cases, the target specific loudness calculations).

The calculations performed by processes or devices 6, 8 and 10 (and by processes or devices 12, 14, 10' in the FIG. 2 example, 6, 14, 10" in the FIG. 3 example, and 8, 12, 10''' in the FIG. 4 example) may be performed explicitly and/or implicitly. Examples of implicit performance include (1) a lookup table whose entries are based in whole or in part on specific loudness and/or target specific loudness and/or modification parameter calculations, and (2) a closed-form mathematical expression that is inherently based in whole or in part on specific loudness and/or target specific loudness and/or modification parameters.

Although the calculation processes or devices 6, 8 and 10 of the FIG. 1 example (and the processes or devices 12, 14, 10' in the FIG. 2 example, 6, 14, 10" in the FIG. 3 example, and 8, 12, 10''' in the FIG. 4 example) are shown schematically and described as separate, this is for purposes of explanation only. It will be understood that ones or all of these processes or devices may be combined in a single process or device or combined variously in multiple processes or devices. For example, in the arrangement of FIG. 9 below, a feed-forward topology as in the example of FIG. 1, the process or device that calculates modification parameters does so in response to the smoothed excitation derived from the audio signal and a target specific loudness. In the FIG. 9 example, the device or process that calculates modification parameters implicitly calculates specific loudness of the audio signal.

As an aspect of the present invention, in the example of FIG. 1 and in other examples of embodiments of the invention herein, the target specific loudness ($\hat{N}[b,t]$) may be calculated by scaling the specific loudness ($N[b,t]$) with one or more scaling factors. The scaling may be a time- and frequency-varying scale factor $\Xi[b,t]$ scaling of the specific loudness as in the relationship $$\hat{N}[b,t] = \Xi[b,t] N[b,t];$$

a time-varying, frequency-invariant scale factor $\Phi[t]$ scaling of the specific loudness as in the relationship $$\hat{N}[b,t] = \Phi[t] N[b,t];$$

a time-invariant, frequency-varying scale factor Θ[b] scaling of the specific loudness as in the relationship $$\hat{N}[b,t] = \Theta[b] N[b,t], \text{ or}$$

a scale factor α scaling of the specific loudness of the audio signal as in the relationship $$\hat{N}[b,t] = \alpha N[b,t];$$

where b is a measure of frequency (e.g., the band number) and t is a measure of time (e.g., the block number). Multiple scalings may also be employed, using multiple instances of a particular scaling and/or combinations of particular scalings. Examples of such multiple scalings are given below. In some cases, as explained further below, the scaling may be a function of the audio signal or measure of the audio signal. In other cases, also as explained further below, when the scaling is not a function of a measure of the audio signal, the scaling may be otherwise determined or supplied. For example, a user could select or apply a time- and frequency-invariant scale factor α or a time-invariant, frequency-varying scale factor Θ[b] scaling.

Thus, the target specific loudness may be expressed as one or more functions F of the audio signal or measure of the audio signal (the specific loudness being one possible measure of the audio signal):

$$\hat{N}[b,t] = F(N[b,t]).$$

Provided that the function or functions F is invertible, the specific loudness (N[b,t]) of the unmodified audio signal may be calculated as the inverse function or functions $F^{-1}$ of the target specific loudness ($\hat{N}[b,t]$):

$$N[b,t] = F^{-1}(\hat{N}[b,t]).$$

As will be seen below, the inverse function or functions $F^{-1}$ is calculated in the feedback and hybrid feed-forward/feedback examples of FIGS. 2 and 4.

A "Select Function(s) and Function Parameter(s)" input for Calculate Target Specific Loudness 6 is shown to indicate that the device or process 6 may calculate the target specific loudness by applying one or more functions in accordance with one or more function parameters. For example, the Calculate Target Specific Loudness 8 may calculate the function or functions "F" of the specific loudness of the audio signal in order to define the target specific loudness. For example, the "Select Function(s) and Function Parameter(s)" input may select one or more particular functions that fall into one or more of the above types of scaling, along with one or more function parameters, such as constants (e.g., scale factors) pertaining to the functions.

The scaling factors associated with a scaling may serve as a representation of the target specific loudness inasmuch as the target specific loudness may be computed as a scaling of the specific loudness, as indicated above. Thus, in the FIG. 9 example, described below and mentioned above, the lookup table may be indexed by scale factors and excitations, such that the calculation of specific loudness and target specific loudness are inherent in the table.

Figure 2:
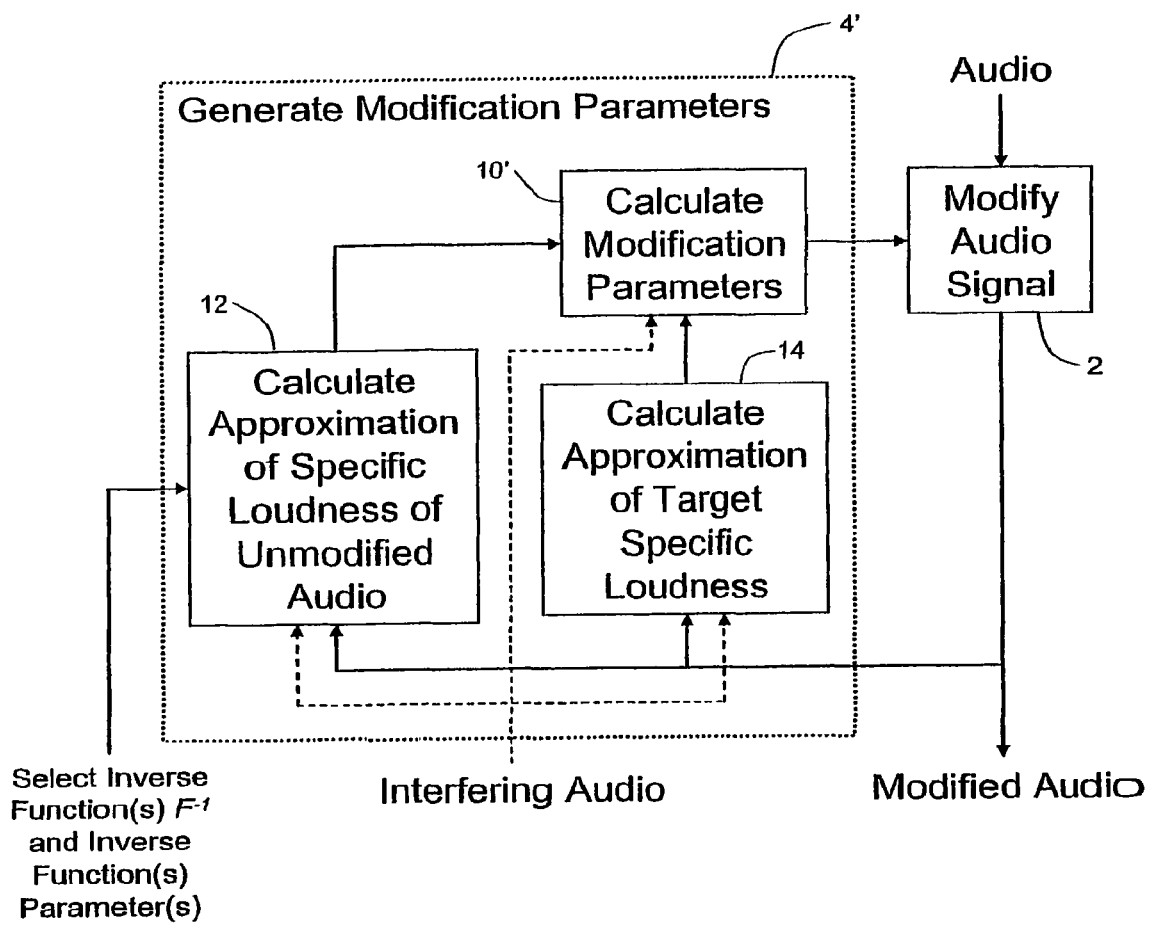
FIG. 2 is a functional block diagram illustrating an example of a feedback implementation according to aspects of the invention.
Figure 3:
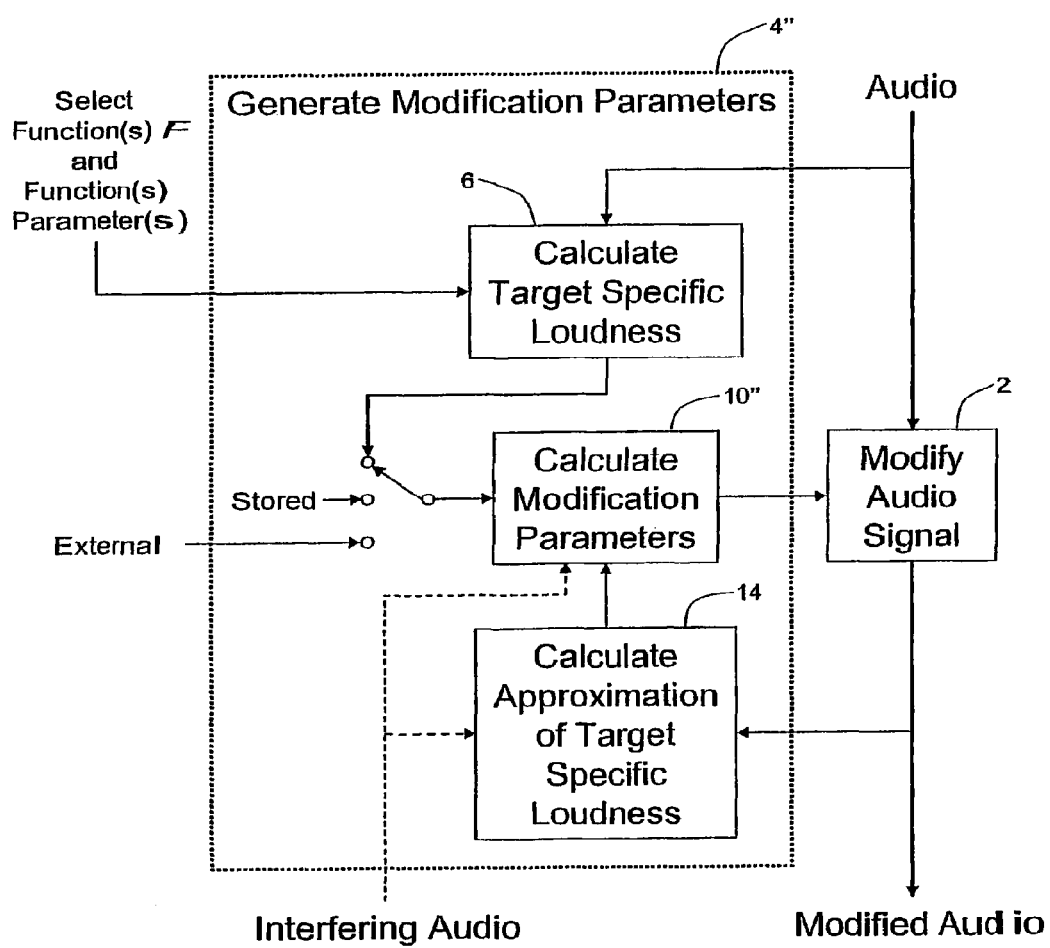
FIG. 3 is a functional block diagram illustrating an example of a hybrid feed-forward/feedback implementation according to aspects of the invention.
Figure 4:
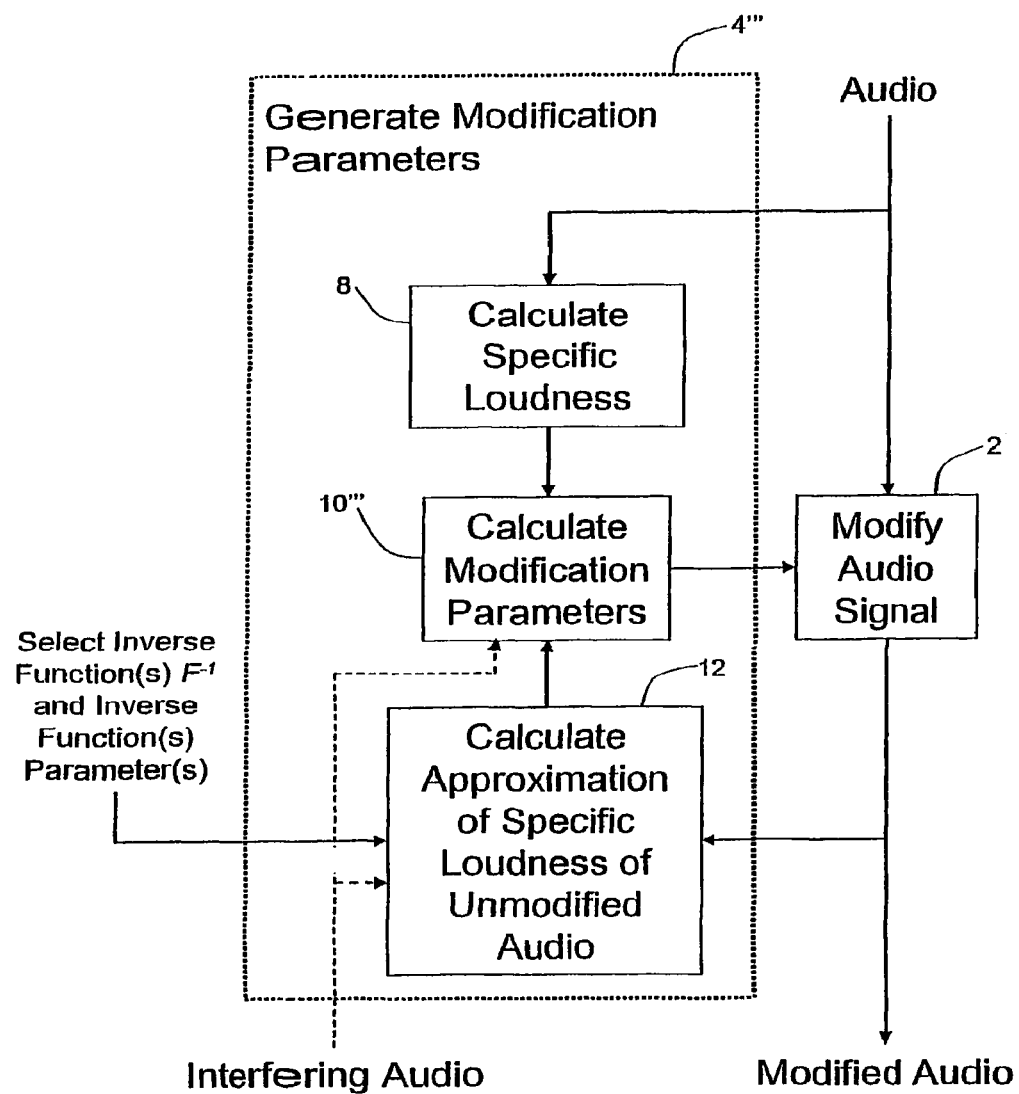
FIG. 4 is a functional block diagram illustrating an example of another hybrid feed-forward/feedback implementation according to aspects of the invention

Whether employing a lookup table, a closed-form mathematical expression, or some other technique, the operation of the Generate Modification Parameters 4 (and its counterpart processes or devices 4', 4" and 4'" in each of the FIGS. 2-4 examples) is such that the calculations are based in the perceptual (psychoacoustic) loudness domain even though specific loudness and target specific loudness may not be explicitly calculated. Either there is an explicit specific loudness or there is a notional, implicit specific loudness. Similarly, either there is an explicit target specific loudness or there is a notional, implicit target specific loudness. In any case, the calculation of modification parameters seeks to generate modification parameters that modify the audio signal to reduce the difference between specific loudness and a target specific loudness.

In a playback environment having a secondary interfering audio signal, such as noise, the Calculate Modification Parameters 10 (and its counterpart processes or devices 10', 10" and 10'" in each of the FIGS. 2-4 examples, respectively) may also receive as an optional input a measure of such a secondary interfering audio signal or the secondary interfering signal itself as one of its inputs. Such an optional input is shown in FIG. 1 (and in FIGS. 2-4) with a dashed lead line. The measure of a secondary interfering signal may be its excitation such as in the example of FIG. 17, described below. The application of a measure of the interfering signal or the signal itself (it being assumed that the interfering signal is separately available for processing) to the Calculate Modification Parameters process or devices 10 in FIG. 1 (and its counterpart processes or devices 10', 10" and 10'" in each of the FIGS. 2-4 examples, respectively) permits a suitably configured such process or device to calculate modification parameters that take the interfering signal into account as explained further below under the heading "Noise Compensation." In the examples of FIGS. 2-4, the calculation of partial specific loudness assumes that a suitable measure of an interfering signal is applied not only to the respective Calculate Modification Parameters 10', 10", or 10'", but also to a "Calculate Approximation of Specific Loudness of Unmodified Audio" process or device 12 and/or a "Calculate Approximation of Target Specific Loudness" process or device 14 in order to facilitate the calculation of partial specific loudness by that function or device. In the FIG. 1 feed-forward example, partial specific loudness is not explicitly calculated—the Calculate Modification Parameters 10 of FIG. 1 calculates the appropriate modification parameters to make the partial specific loudness of the modified audio approximate the target specific loudness. This is explained further below under the heading "Noise Compensation." mentioned above.

As mentioned above, in each of the FIG. 1-4 examples, the modification parameters M, when applied to the audio signal by the Audio Signal Modifier 2, reduce the difference between the specific loudness or the partial specific loudness of the resulting modified audio and the target specific loudness. Ideally, the specific loudness of the modified audio signal closely approximates or is the same as the target specific loudness. The modification parameters M may, for example, take the form of time-varying gain factors applied to the frequency bands derived from a filterbank or to the coefficients of a time-varying filter. Accordingly, in all of the FIG. 1-4 examples, Modify Audio Signal 2 may be implemented as, for example, a plurality of amplitude scalers, each operating in a frequency band, or a time-varying filter (e.g., a multitapped FIR filter or a multipole IIR filter).

Here and elsewhere in this document, the use of the same reference numeral indicates that the device or process may be substantially identical to another or others bearing the same reference numeral. Reference numerals bearing prime numbers (e.g., "10'"') indicates that the device or process is similar to in structure or function but may be a modification of another or others bearing the same basic reference numeral or primed versions thereof.

Under certain constraints, a nearly equivalent feedback arrangement of the feed-forward example of FIG. 1 may be realized. FIG. 2 depicts such an example in which the audio signal is also applied to a Modify Audio Signal process or device 2 in a signal path. The process or device 2 also receives the modification parameters M from a control path in which a Generate Modification Parameters process or device 4' in a feedback arrangement receives as its input the modified audio signal from the output of the Modify Audio Signal 2. Thus, in the FIG. 2 example, the modified audio rather than the unmodified audio is applied to a control path. The Modify Audio Signal process or device 2 and the Generate Modification Parameters process or device 4' modify the audio signal to reduce the difference between its specific loudness and a target specific loudness. The process or device 4' may include several functions and or devices: a "Calculate Approximation of Specific Loudness of Unmodified Audio" process or device 12, a "Calculate Approximation of Target Specific Loudness" process or device 14, and a "Calculate Modification Parameters" process or device 10' that calculates the modification parameters.

With the constraint that the function or functions F is invertible, the process or device 12 estimates the specific loudness of the unmodified audio signal by applying the inverse function $F^1$ to the specific loudness or partial specific loudness of the modified audio signal. The device or process 12 may calculate an inverse function $F^{-1}$, as described above. This is indicated schematically in FIG. 2 as a "Select Inverse Function(s) $F^{-1}$ and Function(s) Parameter(s)" input to process or device 12. The "Calculate Approximation of Target Specific Loudness" 14 operates by calculating the specific loudness or partial specific loudness of the modified audio signal. Such specific loudness or partial specific loudness is an approximation of the target specific loudness. The approximation of the specific loudness of the unmodified audio signal and the approximation of the target specific loudness are used by the Calculate Modification Parameters 10' to derive modification parameters M, which, if applied to the audio signal by the Modify Audio Signal 2, reduce the difference between the specific loudness or the partial specific loudness of the modified audio signal and the target specific loudness. As mentioned above, these modification parameters M may, for example, take the form of time-varying gains applied to the frequency bands of a filterbank or the coefficients of a time-varying filter. In Calculate Modification Parameters 10" practical embodiments the feedback loop may introduce a delay between the computation and application of the modification parameters M.

As mentioned above, in a playback environment having a secondary interfering audio signal, such as noise, the Calculate Modification Parameters 10,' the Calculate Approximation of Specific Loudness of Unmodified Audio 12, and the Calculate Approximation of Target Specific Loudness 14 may each also receive as an optional input a measure of such a secondary interfering audio signal or the secondary interfering signal itself as one of its inputs and process or device 12 and process or device 14 may each calculate the partial specific loudness of the modified audio signal. Such optional inputs are shown in FIG. 2 using dashed lead lines.

As mentioned above, hybrid feed-forward/feedback implementation examples of aspects of the invention are possible. FIGS. 3 and 4 show two examples of such implementations. In the FIGS. 3 and 4 examples, as in the FIGS. 1 and 2 example, the audio signal is also applied to a Modify Audio Signal process or device 2 in a signal path, but Generate Modification Parameters (4" in FIGS. 3 and 4'" in FIG. 4) in respective control paths each receive both the unmodified audio signal and the modified audio signal. In both the FIGS. 3 and 4 examples, the Modify Audio Signal 2 and Generate Modification Parameters (4" and 4''', respectively) modify the audio signal to reduce the difference between its specific loudness, which may be implicit, and a target specific loudness, which may also be implicit.

In the FIG. 3 example, the Generate Modification Parameters process or device 4' may include several functions and or devices: a Calculate Target Specific Loudness 6 as in the FIG. 1 example, a Calculate Approximation of Target Specific Loudness 14, as in the FIG. 2 feedback example, and a "Calculate Modification Parameters" process or device 10". As in the FIG. 1 example, in the feed-forward portion of this hybrid feed-forward/feedback example, the Calculate Target Specific Loudness 6 may perform one or more functions "F", each of which may have function parameters. This is indicated schematically in FIG. 3 as a "Select Function(s) F and Function(s) Parameter(s)" input to process or device 6. In the feedback portion of this hybrid feed-forward/feedback example, the modified audio signal is applied to a Calculate Approximation of Target Specific Loudness 14, as in the FIG. 2 feedback example. Process or device 14 operates in the FIG. 3 example as it does in the FIG. 2 example by calculating the specific loudness or partial specific loudness of the modified audio signal. Such specific loudness or partial specific loudness is an approximation of the target specific loudness. The target specific loudness (from process or device 6) and the approximation of the target specific loudness (from process or device 14) are applied to the Calculate Modification Parameters 10" to derive modification parameters M, which, if applied to the audio signal by the Modify Audio Signal 2, reduce the difference between the specific loudness of the unmodified audio signal and the target specific loudness. As mentioned above, these modification parameters M may, for example, take the form of time-varying gains applied to the frequency bands of a filterbank or the coefficients of a time-varying filter. In practical embodiments, the feedback loop may introduce a delay between the computation and application of the modification parameters M. As mentioned above, in a playback environment having a secondary interfering audio signal, such as noise, the Calculate Modification Parameters 10" and the Calculate Approximation of Target Specific Loudness 14 may each also receive as an optional input a measure of such a secondary interfering audio signal or the secondary interfering signal itself as one of its inputs and process or device 14 may calculate the partial specific loudness of the modified audio signal. The optional inputs are shown in FIG. 3 using dashed lead lines.

The Calculate Modification Parameters 10" may employ an error detecting device or function, such that differences between its target specific loudness and target specification loudness approximation inputs adjust the Modification Parameters so as to reduce the differences between the approximation of the target specific loudness and the "actual" target specific loudness. Such adjustments reduce the differences between the specific loudness of the unmodified audio signal, and the target specific loudness, which may be implicit. Thus, the modification parameters M may be updated based on an error between the target specific loudness, computed in the feed-forward path from the specific loudness of the original audio using the function F, and the target specific loudness approximation computed in the feedback path from specific loudness or partial specific loudness of the modified audio.

In the FIG. 4 example, an alternative feed-forward/feedback example is shown. This alternative differs from the example of FIG. 3 in that the inverse function or functions $F^{-1}$ is calculated in the feedback path rather than the function or functions F being calculated in the feed-forward path. In the FIG. 4 example, the Generate Modification Parameters process or device 4' may include several functions and or devices: a Calculate Specific Loudness 8, as in the FIG. 1 feed-forward example, Calculate Approximation of Specific Loudness of Unmodified Audio 12, as in the FIG. 2 feedback example, and a Calculate Modification Parameters 10'''. The Calculate Specific Loudness 8, as in the FIG. 1 feed-forward example, provides, as an input to the Calculate Modification Parameters 10''', the specific loudness of the unmodified audio signal. As in the FIG. 2 feedback example, with the constraint that the function or functions F is invertible, the process or device 12 estimates the specific loudness of the unmodified audio signal by applying the inverse function $F^{-1}$ to the specific loudness or partial specific loudness of the modified audio signal. A "Select Inverse Function(s) and Inverse Function(s) Parameter(s)" input for Calculate Approximation of Specific Loudness of Unmodified Audio 12 is shown to indicate that the device or process 12 may calculate an inverse function $F^{-1}$, as described above. This is indicated schematically in FIG. 4 as a "Select Inverse Function(s) $F^{-1}$ and Function(s) Parameter(s)" input to process or device 12. Thus, process or device 12 provides as another input to the Calculate Modification Parameters 10''' an approximation to the specific loudness of the unmodified audio signal.

As in the examples of FIGS. 1-3, the Calculate Modification Parameters 10''' derives modification parameters M, which, if applied to the audio signal by the Modify Audio Signal 2, reduce the difference between the specific loudness of the unmodified audio signal and the target specific loudness, which is implicit in this example. As mentioned above, the modification parameters M may, for example, take the form of time-varying gains applied to the frequency bands of a filterbank or the coefficients of a time-varying filter. In practical embodiments, the feedback loop may introduce a delay between the computation and application of the modification parameters M. As mentioned above, in a playback environment having a secondary interfering audio signal, such as noise, the Calculate Modification Parameters 10''' and the Calculate Approximation of Specific Loudness of the Unmodified Audio 12 may each also receive as an optional input a measure of such a secondary interfering audio signal or the secondary interfering signal itself as one of its inputs and process or device 12 may calculate the partial specific loudness of the modified audio signal. The optional inputs are shown in FIG. 4 using dashed lead lines.

The Calculate Modification Parameters 10''' may employ an error detecting device or function, such that differences between its specific loudness and specific loudness approximation inputs produce outputs that adjust the Modification Parameters so as to reduce the differences between the approximation of the specific loudness and the "actual" specific loudness. Because the approximation of the specific loudness is derived from the specific loudness or partial specific loudness of the modified audio, which can be viewed as an approximation of the target specific loudness, such adjustments reduce the differences between the specific loudness of the modified audio signal and the target specific loudness, which is inherent in the function or functions $F^{-1}$. Thus, the modification parameters M may be updated based on an error between the specific loudness, computed in the feed-forward path from the original audio, and the specific loudness approximation computed, using the inverse function or functions $F^{-1}$, in the feedback path from specific loudness or partial specific loudness of the modified audio. Due to the feedback path, practical implementations may introduce a delay between the update and application of the modification parameters.

Although the modification parameters M in the examples of FIGS. 1-4 when applied to a Modify Audio Signal process or device 2 reduce the difference between the specific loudness of the audio signal and the target specific loudness, in practical embodiments the corresponding modification parameters produced in response to the same audio signal may not be identical to each other.

Although not critical or essential to aspects of the present invention, calculation of the specific loudness of the audio signal or the modified audio signal may advantageously employ techniques set forth in said International Patent Application No. PCT/US2004/016964, published as WO 2004/111964 A2, wherein the calculating selects, from a group of two or more specific loudness model functions, one or a combination of two or more of the specific loudness model functions, the selection of which is controlled by the measure of characteristics of the input audio signal. The description of Specific Loudness 104 of FIG. 1, below, describes such an arrangement.

In accordance with further aspects of the invention, the unmodified audio signal and either (1) the modification parameters or (2) the target specific loudness or a representation of the target specific loudness (e.g., scale factors usable in calculating, explicitly or implicitly, target specific loudness) may be stored or transmitted for use, for example, in a temporally and/or spatially separated device or process. The modification parameters, target specific loudness, or representation of the target specific loudness may be determined in any suitable way, as, for example, in one of the feed-forward, feedback, and hybrid feed-forward feedback arrangement examples of FIGS. 1-4, as described above. In practice, a feed-forward arrangement, such as in the example of FIG. 1, is the least complex and fastest inasmuch as it avoids calculations based on the modified audio signal. An example of transmitting or storing the unmodified audio and the modification parameters is shown in FIG. 5, while an example of the transmitting or storing the unmodified audio and the target specific loudness or a representation of the target specific loudness is shown in FIG. 6.

Figure 5:
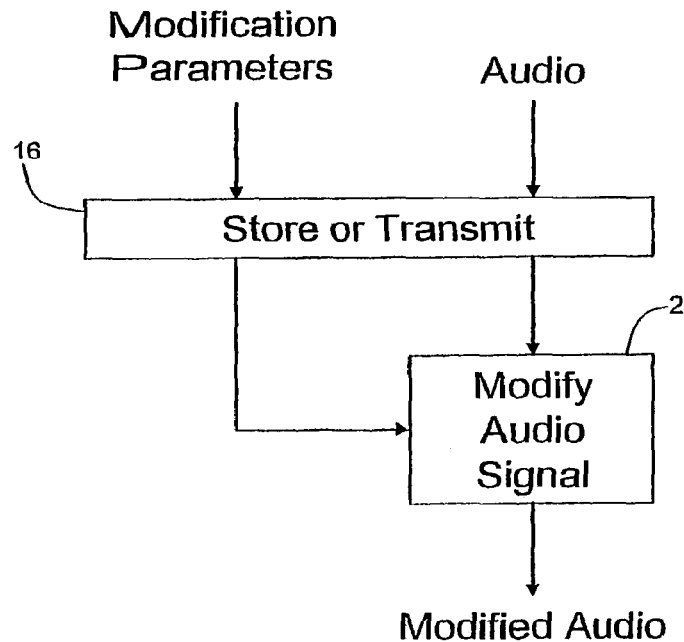
FIG. 5 is a functional block diagram illustrating the manner in which the unmodified audio signal and the modification parameters as determined by any one of the feed-forward, feedback, and hybrid feed-forward feedback arrangements may be stored or transmitted for use, for example, in a temporally or spatially separated device or process.
Figure 6:
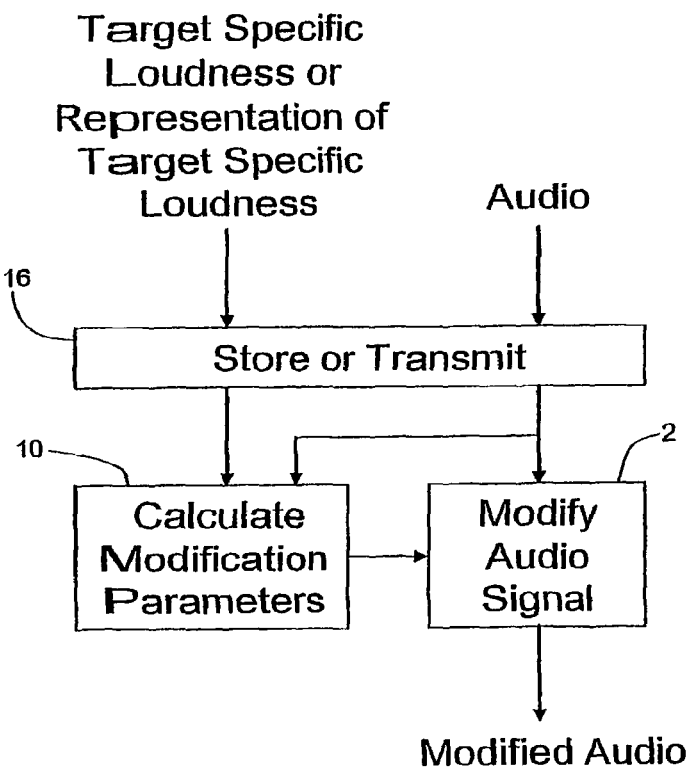
FIG. 6 is a functional block diagram illustrating the manner in which the unmodified audio signal and a target specific loudness or representation thereof as determined by any one of the feed-forward, feedback, and hybrid feed-forward feedback arrangements may be stored or transmitted for use, for example, in a temporally or spatially separated device or process.

An arrangement such as in the example of FIG. 5 may be used to temporally and/or spatially separate the application of the modification parameters to the audio signal from the generation of such modification parameters. An arrangement such as in the example of FIG. 6 may be used to temporally and/or spatially separate both the generation and application of the modification parameters from the generation of the target specific loudness or representation of it. Both types of arrangements make possible a simple low-cost playback or reception arrangement that avoids the complexity of generating the modification parameters or of generating the target specific loudness. Although a FIG. 5 type arrangement is simpler than a FIG. 6 type arrangement, the FIG. 6 arrangement has the advantage that the information required to be stored or transmitted may be much less, particularly when a representation of the target specific loudness, such as one or more scale factors are stored or transmitted. Such a reduction in information storage or transmission may be particularly useful in low-bit-rate audio environments.

Accordingly, further aspects of the present invention are the provision of a device or process (1) that receives or plays back, from a store or transmit device or process, modification parameters M and applies them to an audio signal that is also received or (2) that receives or plays back, from a store or transmit device or process, a target specific loudness or representation of a target specific loudness, generates modification parameters M by applying the target specific loudness or representation thereof to the audio signal that is also received (or to a measure of the audio signal such as its specific loudness, which may be derived from the audio signal), and applies the modification parameters M to the received audio signal. Such devices or processes may be characterized as decoding processes or decoders; while the devices or processes required to produce the stored or transmitted information may be characterized as encoding processes or encoders. Such encoding processes or encoders are those portions of the FIGS. 1-4 arrangement examples that are usable to produce the information required by the respective decoding processes or decoders. Such decoding processors or decoders may be associated or operative with virtually any type of process or device that processes and/or reproduces sound.

In one aspect of the invention, as in the example of FIG. 5, the unmodified audio signal and the modification parameters M produced by, for example, a modification parameter generating process or generator such as Generate Modification Parameters 4 of FIG. 1, 4' of FIG. 2, 4" of FIG. 3 or 4''' of FIG. 4 may be applied to any suitable storage or transmission device or function ("Store or Transmit") 16. In the case of using the feed-forward example of FIG. 1 as an encoding process or an encoder, the Modify Audio Signal 2 would not be required to generate the modified audio and could be omitted if there is no requirement to provide the modified audio at the temporal or spatial location of the encoder or encoding process. The Store or Transmit 16 may include, for example, any suitable magnetic, optical or solid-state storage and playback devices or any suitable wired or wireless transmission and reception devices, the choice thereof not being critical to the invention. The played-back or received modification parameters may then be applied to a Modify Audio Signal 2, of the type employed in the examples of FIGS. 1-4, in order to modify the played-back or received audio signal so that its specific loudness approximates the target specific loudness of or inherent in the arrangement in which the modification parameters were derived. The modification parameters may be stored or transmitted in any of various ways. For example, they may be stored or transmitted as metadata accompanying the audio signal, they may be sent in separate paths or channels, they may be steganographically encoded in the audio, they may be multiplexed, etc. The use of the modification parameters to modify the audio signal may be optional and, if optional, their use may be selectable, for example, by a user. For example, the modification parameters if applied to the audio signal might reduce the dynamic range of the audio signal. Whether or not to employ such dynamic range reduction could be selectable by a user.

In another aspect of the invention, as in the example of FIG. 6, the unmodified audio signal and the target specific loudness or representation of the target specific loudness may be applied to any suitable storage or transmission device or function ("Store or Transmit") 16. In the case of using a feed-forward configuration, such as the example of FIG. 1, as an encoding process or an encoder, neither a Calculate Modification Parameters 10 type process or device nor a Modify Audio Signal 2 type process or device would be required and could be omitted if there is no requirement to provide either the modification parameters or the modified audio at the temporal or spatial location of the encoder or encoding process. As in the case of the FIG. 5 example, the Store or Transmit 16 may include, for example, any suitable magnetic, optical or solid-state storage and playback devices or any suitable wired or wireless transmission and reception devices, the choice thereof not being critical to the invention. The played-back or received target specific loudness or representation of the target specific loudness may then be applied, along with the unmodified audio, to a Calculate Modification Parameters 10, of the type employed in the example of FIG. 1, or to a Calculate Modification Parameters 10", of the type employed in the example of FIG. 3, in order to provide modification parameters M that may then be applied to Modify Audio Signal 2, of the type employed in the examples of FIGS. 1-4, in order to modify the played-back or received audio signal so that its specific loudness approximates the target specific loudness of or inherent in the arrangement in which the modification parameters were derived. Although the target specific loudness or representation thereof may be most readily obtained in an encoding process or encoder of the FIG. 1 example type, the target specific loudness or representation thereof or an approximation to the target specific loudness or representation thereof may be obtained in an encoding process or encoder of the FIG. 2 through 4 example types (approximations are calculated in processes or devices 14 of FIGS. 2 and 3 and in process or device 12 of FIG. 4). The target specific loudness or representation thereof may be stored or transmitted in any of various ways. For example, it may be stored or transmitted as metadata accompanying the audio signal, it may be sent in separate paths or channels, it may be steganographically encoded in the audio, it may be multiplexed, etc. The use of the modification parameters derived from the stored or transmitted target specific loudness or representation to modify the audio signal may be optional and, if optional, their use may be selectable, for example, by a user. For example, the modification parameters if applied to the audio signal might reduce the dynamic range of the audio signal. Whether or not to employ such dynamic range reduction could be selectable by a user.

When implementing the disclosed invention as a digital system, a feed-forward configuration is the most practical, and examples of such configurations are therefore described below in detail, it being understood that the scope of the invention is not so limited.

Throughout this document, terms such as "filter" or "filterbank" are used herein to include essentially any form of recursive and non-recursive filtering such as IIR filters or transforms, and "filtered" information is the result of applying such filters. Embodiments described below employ filterbanks implemented by transforms.

Figure 7:
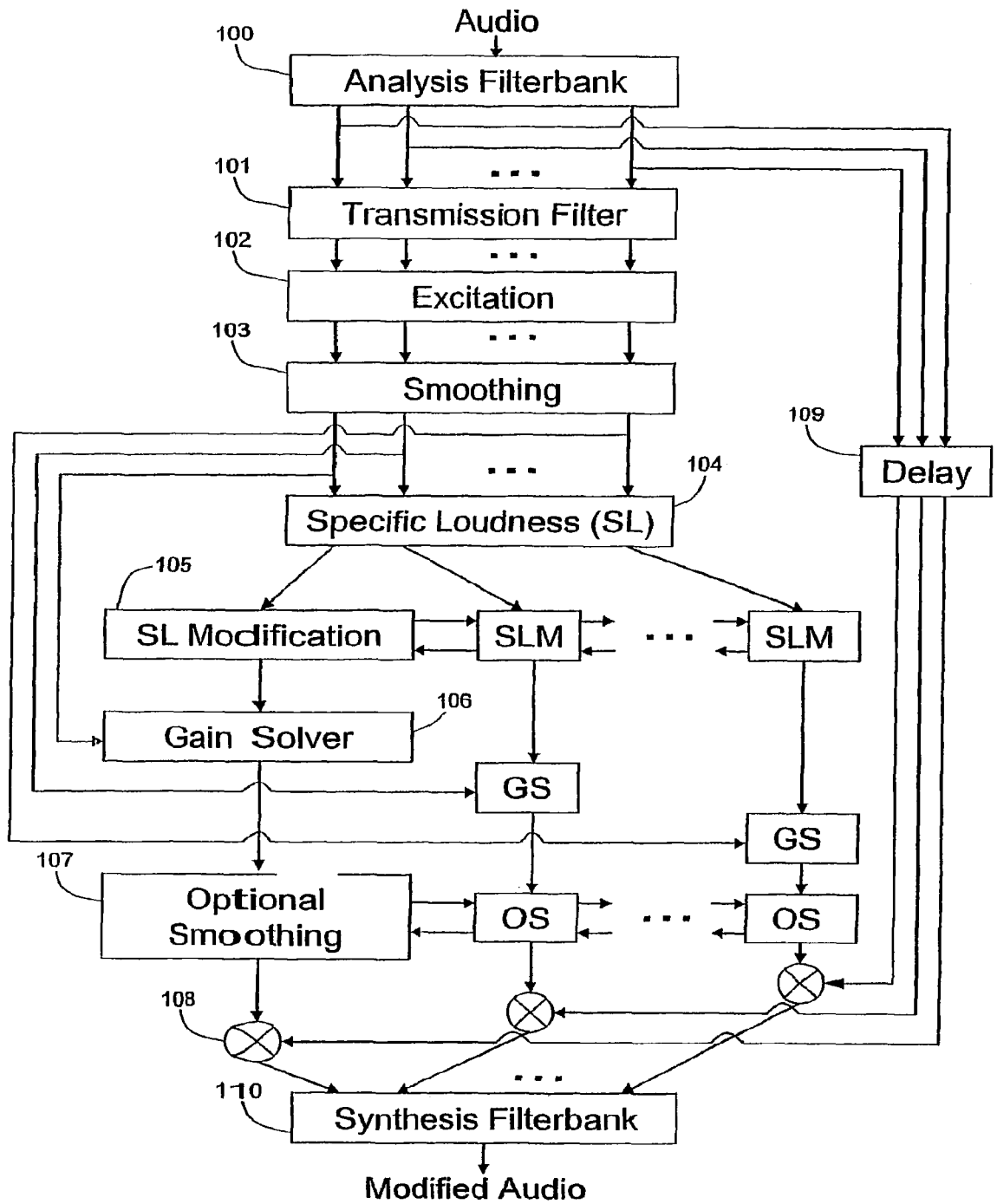
FIG. 7 is a schematic functional block diagram or schematic flow chart showing an overview of an aspect of the present invention.

FIG. 7 depicts greater details of an exemplary embodiment of an aspect of the invention embodied in a feed-forward arrangement. Audio first passes through an analysis filterbank function or device ("Analysis Filterbank") 100, which splits the audio signal into a plurality of frequency bands (hence, FIG. 5 shows multiple outputs from Analysis Filterbank 100, each output representing a frequency band, which output carries through the various functions or devices up to an synthesis filterbank, which sums the bands to a combined wideband signal, as described further below). The response of the filter associated with each frequency band in the Analysis Filterbank 100 is designed to simulate the response at a particular location of the basilar membrane in the inner ear. The output of each filter in the Analysis Filterbank 100 next passes into a transmission filter or transmission filter function ("Transmission Filter") 101 that simulates the filtering effect of the transmission of audio through the outer and middle ear. If only the loudness of the audio were to be measured, the transmission filter could be applied prior to the analysis filterbank, but because the analysis filterbank outputs are used to synthesize the modified audio it is advantageous to apply the transmission filter after the filterbank. The outputs of Transmission Filter 101 next pass into an excitation function or device ("Excitation") 102, the outputs of which simulate the distribution of energy along the basilar membrane. The excitation energy values may be smoothed across time by a smoothing function or device ("Smoothing") 103. The time constants of the smoothing function are set in accordance with the requirements of a desired application. The smoothed excitation signals are subsequently converted into specific loudness in specific loudness function or device ("Specific Loudness (SL)") 104. Specific loudness is represented in units of sone per unit frequency. The specific loudness component associated with each band is passed into specific loudness modification function or device ("SL Modification") 105. SL Modification 105 takes as its input the original specific loudness and then outputs a desired or "target" specific loudness, which, according to an aspect of the present invention, is preferably a function of the original specific loudness (see the next heading below, entitled "Target Specific Loudness"). The SL Modification 105 may operate independently on each band, or there may exist an interdependence between or among bands (a frequency smoothing as suggested by the cross-connecting lines in FIG. 7), depending on the desired effect. Taking as its inputs the smoothed excitation frequency band components from Excitation 102 and the target specific loudness from the SL Modification 105, a gain solver function or device ("Gain Solver") 106 determines the gain that needs to be applied to each band of the output of the Analysis Filterbank 100 in order to transform the measured specific loudness into the target specific loudness. The Gain Solver may be implemented in various ways. For example, the Gain Solver may include an iterative process such as in the manner of that disclosed in said International Patent Application No. PCT/US2004/016964, published as WO 2004/111964 A2, or, alternatively, a table lookup. Although the gains per band generated by the Gain Solver 106 may be smoothed further over time by optional smoothing function or device ("Smoothing") 107 in order to minimize perceptual artifacts, it is preferred that temporal smoothing be applied elsewhere in the overall process or device, as described elsewhere. Finally, the gains are applied to respective bands of the Analysis Filterbank 100 through a respective multiplicative combining function or combiner 108, and the processed or "modified" audio is synthesized from the gain-modified bands in a synthesis filterbank function or device ("Synthesis Filterbank) 110. In addition, the outputs from the analysis filterbank may be delayed by a delay function or device ("Delay") 109 prior to application of the gains in order to compensate for any latency associated with the gain computation. Alternatively, instead of calculating gains for use in applying gain modifications in frequency bands, the Gain Solvers 106 may calculate filter coefficients that control a time-varying filter, such as a multitapped FIR filter or a multipole IIR filter. For simplicity in exposition, aspects of the invention are mainly described as employing gain factors applied to frequency bands, it being understood that filter coefficients and time-varying filters may also be employed in practical embodiments.

In practical embodiments, processing of the audio may be performed in the digital domain. Accordingly, the audio input signal is denoted by the discrete time sequence x[n] which has been sampled from the audio source at some sampling frequency $f_s$. It is assumed that the sequence x[n] has been appropriately scaled so that the rms power of x[n] in decibels given by $$RMS_{dB} = 10\log_{10}\left(\frac{1}{L}\sum_{n=0}^{L} x^2[n]\right)$$

is equal to the sound pressure level in dB at which the audio is being auditioned by a human listener. In addition, the audio signal is assumed to be monophonic for simplicity of exposition.

Analysis Filterbank 100, Transmission Filter 101, Excitation 102, Specific Loudness 104, Specific Loudness Modification 105, Gain Solver 106, and Synthesis Filterbank 110 may be described in greater detail as follows.

Analysis Filterbank 100

The audio input signal is applied to an analysis filterbank or filterbank function ("Analysis Filterbank") 100. Each filter in Analysis Filterbank 100 is designed to simulate the frequency response at a particular location along the basilar membrane in the inner ear. The Filterbank 100 may include a set of linear filters whose bandwidth and spacing are constant on the Equivalent Rectangular Bandwidth (ERB) frequency scale, as defined by Moore, Glasberg and Baer (B. C. J. Moore, B. Glasberg, T. Baer, "A Model for the Prediction of Thresholds, Loudness, and Partial Loudness," supra).

Although the ERB frequency scale more closely matches human perception and shows improved performance in producing objective loudness measurements that match subjective loudness results, the Bark frequency scale may be employed with reduced performance.

For a center frequency f in hertz, the width of one ERB band in hertz may be approximated as:

$$ERB(f) = 24.7(4.37f/1000+1) \qquad (1)$$

From this relation a warped frequency scale is defined such that at any point along the warped scale, the corresponding ERB in units of the warped scale is equal to one. The function for converting from linear frequency in hertz to this ERB frequency scale is obtained by integrating the reciprocal of Eqn. 1:

$$HzToERB(f) = \int \frac{1}{24.7(4.37f/1000+1)} df \qquad (2a)$$
$$= 21.4\log_{10}(4.37f/1000+1)$$

Figure 9:
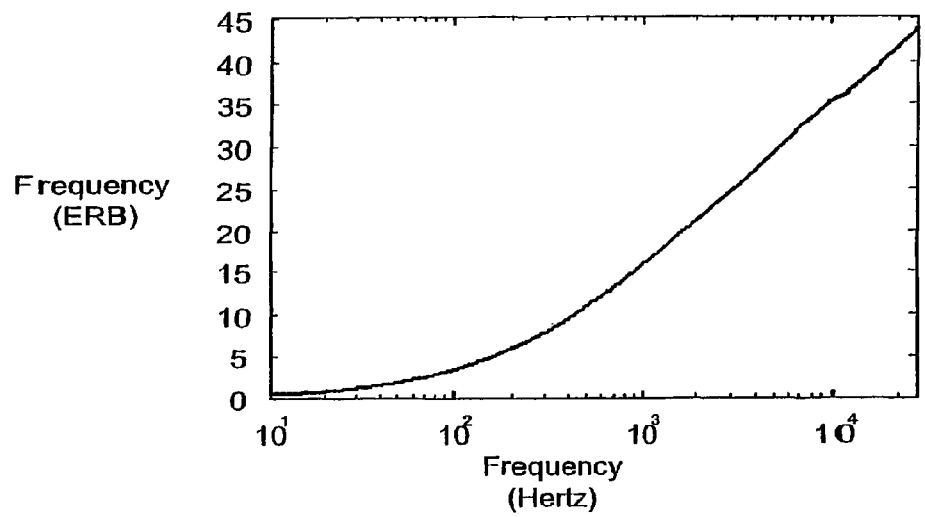
FIG. 9 shows the relationship between the ERB frequency scale (vertical axis) and frequency in Hertz (horizontal axis).

It is also useful to express the transformation from the ERB scale back to the linear frequency scale by solving Eqn. 2a for f:

$$ERBToHz(e) = f = \frac{1000}{4.37} 10^{(e/21.4-1)}, \qquad (2b)$$

where e is in units of the ERB scale. FIG. 9 shows the relationship between the ERB scale and frequency in hertz.

The Analysis Filterbank 100 may include B auditory filters, referred to as bands, at center frequencies $f_c[1] \ldots f_c[B]$ spaced uniformly along the ERB scale. More specifically, $$f_c[1] = f_{min} \qquad (3a)$$

$$f_c[b] = f_c[b-1] + ERBToHz(HzToERB(f_c[b-1])+\Delta) \; b = 2 \ldots B \qquad (3b)$$

$$f_c[B] \leq f_{max} \qquad (3c)$$

where $\Delta$ is the desired ERB spacing of the Analysis Filterbank 100, and where $f_{min}$ and $f_{max}$ are the desired minimum and maximum center frequencies, respectively. One may choose $\Delta=1$, and taking into account the frequency range over which the human ear is sensitive, one may set $f_{min}$=50 Hz and $f_{max}$=20,000 Hz. With such parameters, for example, application of Eqns. 3a-c yields B=40 auditory filters.

The magnitude frequency response of each auditory filter may be characterized by a rounded exponential function, as suggested by Moore and Glasberg. Specifically, the magnitude response of a filter with center frequency $f_c[b]$ may be computed as:

$$H_b(f) = (1 + pg)e^{-pg} \quad (4a)$$
where
$$g = \left| \frac{f - f_c[b]}{f_c[b]} \right|, \quad (4b)$$

$$p = \frac{4 f_c[b]}{ERB(f_c[b])} \quad (4c)$$

Figure 10:
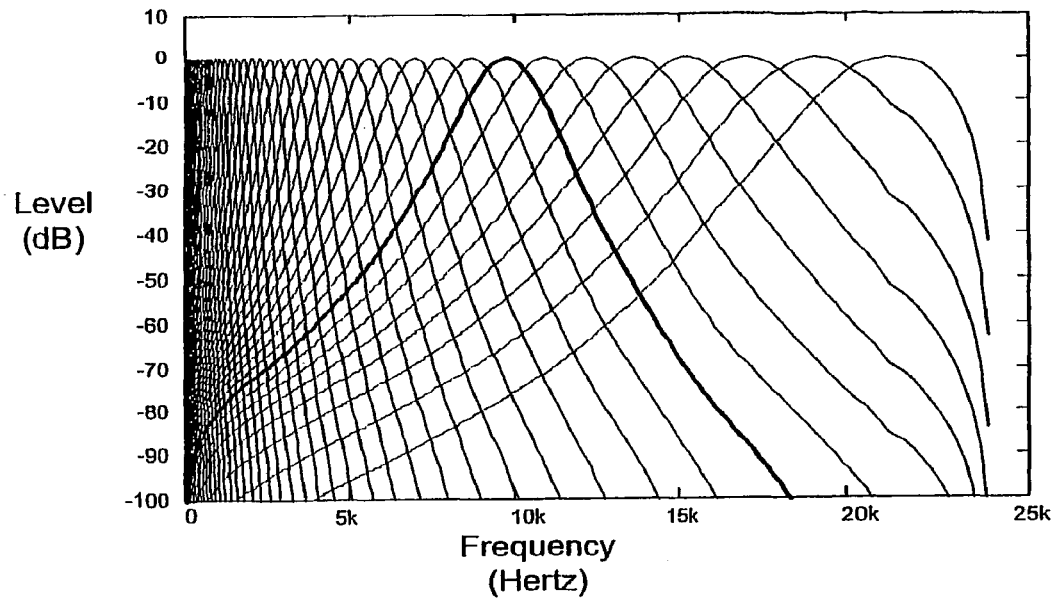
FIG. 10 shows a set idealized auditory filter characteristic responses that approximate critical banding on the ERB scale. The horizontal scale is frequency in Hertz and the vertical scale is level in decibels.

The magnitude responses of such B auditory filters, which approximate critical banding on the ERB scale, are shown in FIG. 10.

The filtering operations of Analysis Filterbank 100 may be adequately approximated using a finite length Discrete Fourier Transform, commonly referred to as the Short-Time Discrete Fourier Transform (STDFT), because an implementation running the filters at the sampling rate of the audio signal, referred to as a full-rate implementation, is believed to provide more temporal resolution than is necessary for accurate loudness measurements. By using the STDFT instead of a full-rate implementation, an improvement in efficiency and reduction in computational complexity may be achieved.

The STDFT of input audio signal x[n] is defined as:

$$X[k, t] = \sum_{n=0}^{N-1} w[n]x[n + tT]e^{-j\frac{2\pi k}{N}}, \quad (5a)$$

where k is the frequency index, t is the time block index, N is the DFT size, T is the hop size, and w[n] is a length N window normalized so that $$\sum_{n=0}^{N-1} w^2[n] = 1 \quad (5b)$$

Note that the variable t in Eqn. 5a is a discrete index representing the time block of the STDFT as opposed to a measure of time in seconds. Each increment in t represents a hop of T samples along the signal x[n]. Subsequent references to the index t assume this definition. While different parameter settings and window shapes may be used depending upon the details of implementation, for L=44100 Hz, choosing N=2048, T=1024, and having w[n] be a Hamming window provides an adequate balance of time and frequency resolution. The STDFT described above may be more efficient using the Fast Fourier Transform (FFT).

Instead of the STDFT, the Modified Discrete Cosine Transform (MDCT) may be utilized to implement the analysis filterbank. The MDCT is a transform commonly used in perceptual audio coders, such as Dolby AC-3. If the disclosed system is implemented with such perceptually coded audio, the disclosed loudness measurement and modification may be more efficiently implemented by processing the existing MDCT coefficients of the coded audio, thereby eliminating the need to perform the analysis filterbank transform. The MDCT of the input audio signal x[n] is given by:

$$X[k, t] = \sum_{n=0}^{N-1} w[n]x[n + tT]\cos((2\pi/N)(k + 1/2)(n + n_0)), \quad (6)$$

where $n_0 = \frac{(N/2) + 1}{2}$

Generally, the hopsize T is chosen to be exactly one-half the transform length N so that perfect reconstruction of the signal x[n] is possible.

Transmission Filter 101

Figure 8:
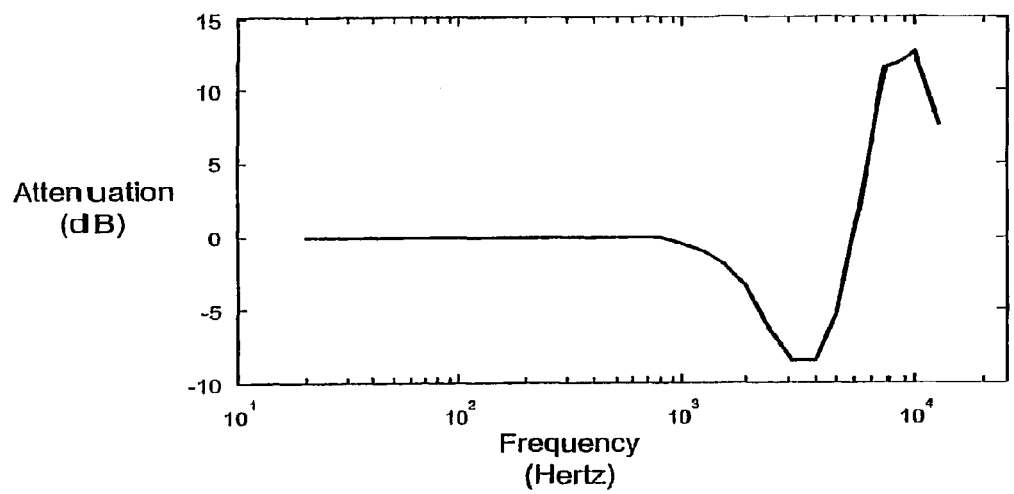
FIG. 8 is an idealized characteristic response of a linear filter P(z) suitable as a transmission filter in an embodiment of the present invention in which the vertical axis is attenuation in decibels (dB) and the horizontal axis is a logarithmic base 10 frequency in Hertz (Hz).

The outputs of Analysis Filterbank 100 are applied to a transmission filter or transmission filter function ("Transmission Filter") 101 which filters each band of the filterbank in accordance with the transmission of audio through the outer and middle ear. FIG. 8 depicts one suitable magnitude frequency response of the transmission filter, P(f), across the audible frequency range. The response is unity below 1 kHz, and, above 1 kHz, follows the inverse of the threshold of hearing as specified in the ISO226 standard, with the threshold normalized to equal unity at 1 kHz.

Excitation 102

In order to compute the loudness of the input audio signal, a measure of the audio signals' short-time energy in each filter of the Analysis Filterbank 100 after application of the Transmission Filter 101 is needed. This time and frequency varying measure is referred to as the excitation. The short-time energy output of each filter in Analysis Filterbank 100 may be approximated in Excitation Function 102 through multiplication of filter responses in the frequency domain with the power spectrum of the input signal.

$$E[b, t] = \frac{1}{N} \sum_{k=0}^{N-1} |H_b[k]|^2 |P[k]|^2 |X[k, t]|^2, \quad (7)$$

where b is the band number, t is the block number, and $H_b[k]$ and P[k] are the frequency responses of the auditory filter and transmission filter, respectively, sampled at a frequency corresponding to STDFT or MDCT bin index k. It should be noted that forms for the magnitude response of the auditory filters other than that specified in Eqns. 4a-c may be used in Eqn. 7 to achieve similar results. For example, said International Application No. PCT/US2004/016964, published as WO 2004/111964 A2, describes two alternatives: an auditory filter characterized by a $12^{th}$ order IIR transfer function, and a low-cost "brick-wall" band pass approximation.

In summary, the output of Excitation Function 102 is a frequency domain representation of energy E in respective ERB bands b per time period t.

Time Averaging ("Smoothing") 103

For certain applications of the disclosed invention, as described below, it may be desirable to smooth the excitation E[b,t] prior to its transformation to specific loudness. For example, smoothing may be performed recursively in Smoothing function 103 according to the equation:

$$\bar{E}[b,t] = \lambda_b \bar{E}[b,t] + (1-\lambda_b)E[b,t], \qquad (8)$$

where the time constants $\lambda_b$ at each band b are selected in accordance with the desired application. In most cases the time constants may be advantageously chosen to be proportionate to the integration time of human loudness perception within band b. Watson and Gengel performed experiments demonstrating that this integration time is within the range of 150-175 ms at low frequencies (125-200 Hz) and 40-60 ms at high frequencies (Charles S. Watson and Roy W. Gengel, "Signal Duration and Signal Frequency in Relation to Auditory Sensitivity" *Journal of the Acoustical Society of America*, Vol. 46, No. 4 (Part 2), 1969, pp. 989-997).

Specific Loudness 104

In the specific loudness converter or conversion function ("Specific Loudness") 104, each frequency band of the excitation is converted into a component value of the specific loudness, which is measured in sone per ERB.

Figure 11:
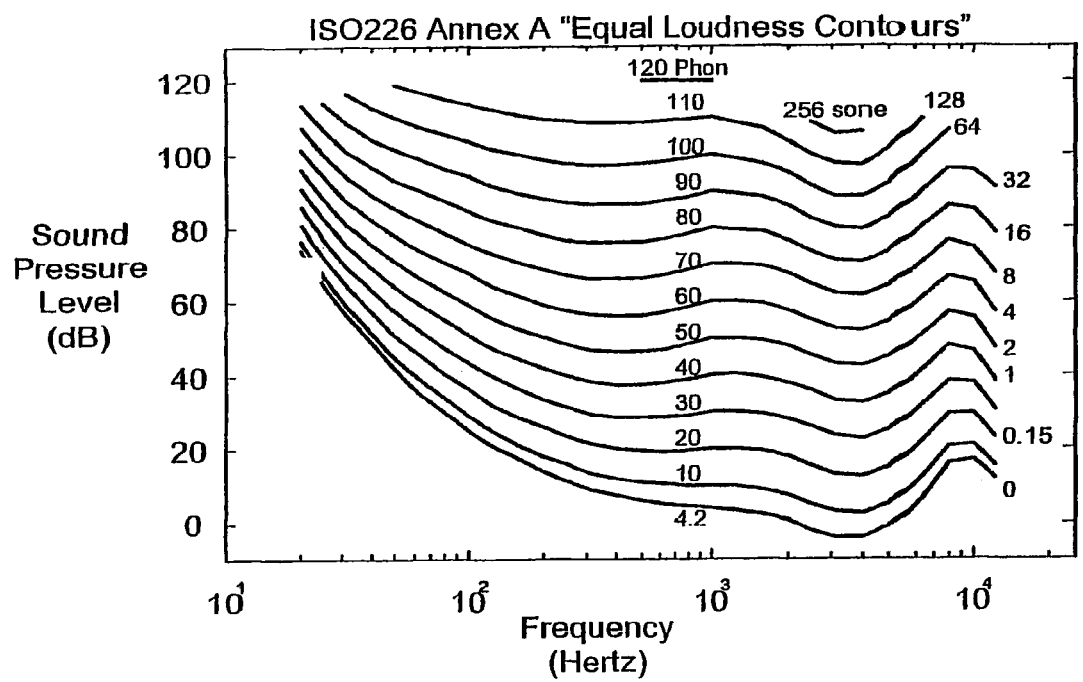
FIG. 11 shows the equal loudness contours of ISO 226. The horizontal scale is frequency in Hertz (logarithmic base 10 scale) and the vertical scale is sound pressure level in decibels.
Figure 12:
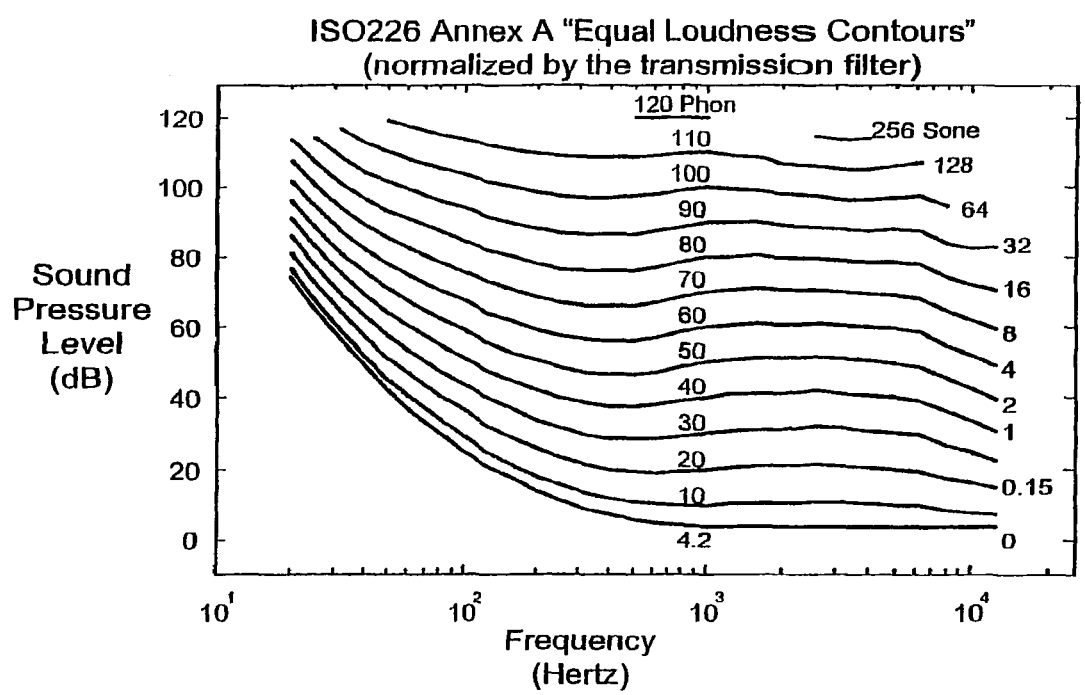
FIG. 12 shows the equal loudness contours of ISO 226 normalized by the transmission filter P(z). The horizontal scale is frequency in Hertz (logarithmic base 10 scale) and the vertical scale is sound pressure level in decibels.

Initially, in computing specific loudness, the excitation level in each band of $\bar{E}[b,t]$ may be transformed to an equivalent excitation level at 1 kHz as specified by the equal loudness contours of ISO 226 (FIG. 11) normalized by the transmission filter P(z) (FIG. 12):

$$\bar{E}_{1kHz}[b,t]T_{1kz}(\bar{E}[b,t],f_c[b]), \qquad (9)$$

where $T_{1kHz}(E, f)$ is a function that generates the level at 1 kHz, which is equally loud to level E at frequency f. In practice, $T_{1kHz}(E, f)$ is implemented as an interpolation of a look-up table of the equal loudness contours, normalized by the transmission filter. Transformation to equivalent levels at 1 kHz simplifies the following specific loudness calculation. Next, the specific loudness in each band may be computed as:

$$N[b,t] = \alpha[b,t]N_{NB}[b,t] + (1-\alpha[b,t])N_{WB}[b,t], \qquad (10)$$

where $N_{NB}[b,t]$ and $N_{WB}[b,t]$ are specific loudness values based on a narrowband and wideband signal model, respectively. The value $\alpha[b,t]$ is an interpolation factor lying between 0 and 1 that is computed from the audio signal. Said International Application No. PCT/US2004/016964, published as WO 2004/111964 A2, describes a technique for calculating $\alpha[b,t]$ from the spectral flatness of the excitation. It also describes "narrowband" and "wideband" signal models in greater detail.

The narrowband and wideband specific loudness values $N_{NB}[b,t]$ and $N_{WB}[b,t]$ may be estimated from the transformed excitation using the exponential functions:

$$N_{NB}[b,t] = \begin{cases} G_{NB}\left(\left(\frac{\bar{E}_{1kHz}[b,t]}{TQ_{1kHz}}\right)^{\beta_{NB}} - 1\right), & \bar{E}_{1kHz}[b,t] > TQ_{1kHz} \\ 0, & \text{otherwise} \end{cases} \qquad (11a)$$

$$N_{WB}[m,t] = \begin{cases} G_{WB}\left(\left(\frac{\bar{E}_{1kHz}[b,t]}{TQ_{1kHz}}\right)^{\beta_{WB}} - 1\right), & \bar{E}_{1kHz}[b,t] > TQ_{1kHz} \\ 0, & \text{otherwise,} \end{cases} \qquad (11b)$$

where $TQ_{1kHz}$ is the excitation level at threshold in quiet for a 1 kHz tone. From the equal loudness contours (FIGS. 11 and 12) $TQ_{1kHz}$ equals 4.2 dB. One notes that both of these specific loudness functions are equal to zero when the excitation is equal to the threshold in quiet. For excitations greater than the threshold in quiet, both functions grow monotonically with a power law in accordance with Stevens' law of intensity sensation. The exponent for the narrowband function is chosen to be larger than that of the wideband function, making the narrowband function increase more rapidly than the wideband function. The specific selection of exponents β and gains G for the narrowband and wideband cases and are chosen to match experimental data on the growth of loudness for tones and noise.

Moore and Glasberg suggest that the specific loudness should be equal to some small value instead of zero when the excitation is at the threshold of hearing. Specific loudness should then decrease monotonically to zero as the excitation decreases to zero. The justification is that the threshold of hearing is a probabilistic threshold (the point at which a tone is detected 50% of the time), and that a number of tones, each at threshold, presented together may sum to a sound that is more audible than any of the individual tones. In the disclosed application, augmenting the specific loudness functions with this property has the added benefit of making the gain solver, discussed below, behave more appropriately when the excitation is near threshold. If the specific loudness is defined to be zero when the excitation is at or below threshold, then a unique solution for the gain solver does not exist for excitations at or below threshold. If, on the other hand, specific loudness is defined to be monotonically increasing for all values of excitation greater than or equal to zero, as suggested by Moore and Glasberg, then a unique solution does exist. Loudness scaling greater than unity will always result in a gain greater than unity and vice versa. The specific loudness functions in Eqns. 11a and 11b may be altered to have the desired property according to:

$$N_{NB}[b,t] = \qquad (11c)$$

$$\begin{cases} G_{NB}\left(\left(\frac{\bar{E}_{1kHz}[b,t]}{TQ_{1kHz}}\right)^{\beta_{NB}} - 1\right), & \bar{E}_{1kHz}[b,t] > \lambda TQ_{11kHz} \\ \exp\left\{K_{NB}\left(-\log\left(\frac{\bar{E}_{1kHz}[b,t]}{TQ_{1kHz}}\right) + C_{NB}\right)^{\eta_{NB}}\right\}, & \text{otherwise} \end{cases}$$

$$N_{WB}[m,t] = \qquad (11d)$$

$$\begin{cases} G_{WB}\left(\left(\frac{\bar{E}_{1kHz}[b,t]}{TQ_{1kHz}}\right)^{\beta_{WB}} - 1\right), & \bar{E}_{1kHz}[b,t] > \lambda TQ_{1kHz} \\ \exp\left\{K_{WB}\left(-\log\left(\frac{\bar{E}_{1kHz}[b,t]}{TQ_{1kHz}}\right) + C_{WB}\right)^{\eta_{WB}}\right\}, & \text{otherwise,} \end{cases}$$

where the constant λ is greater than one, the exponent η is less than one, and the constants K and C are chosen so that the specific loudness function and its first derivative are continuous at the point $\bar{E}_{1kHz}[b,t] = \lambda TQ_{1kHz}$.

From the specific loudness, the overall or "total" loudness L[t] is given by the sum of the specific loudness across all bands b:

$$L[t] = \sum_b N[b,t] \qquad (12)$$

Specific Loudness Modification 105

In the specific loudness modification function ("Specific Loudness Modification") 105, the target specific loudness, referred to as $\hat{N}[b,t]$, may be calculated from the specific loudness of SL 104 (FIG. 7) in various ways depending on the desired application of the overall device or process. As is described in greater detail below, a target specific loudness may be calculated using a scale factor α, for example, in the case of a volume control. See Eqn. 16 below and its associated description. In the case of automatic gain control (AGC) and dynamic range control (DRC), a target specific loudness may be calculated using a ratio of desired output loudness to input loudness. See Eqns. 17 and 18 below and their associated descriptions. In the case of dynamic equalization, a target specific loudness may be calculated using a relationship set forth in Eqn. 23 and its associated description.

Gain Solver 106

In this example, for each band b and every time interval t, the Gain Solver 106 takes as its inputs the smoothed excitation $\bar{E}[b,t]$ and the target specific loudness $\hat{N}[b,t]$ and generates gains $G[b,t]$ used subsequently for modifying the audio. Letting the function $\Psi\{\bullet\}$ epresent the non-linear transformation from excitation to specific loudness such that $$N[b,t]=\Psi\{\bar{E}[b,t]\}, \quad (13)$$

the Gain Solver finds $G[b,t]$ such that $$\hat{N}[b,t]=\Psi\{G^2[b,t]\bar{E}[b,t]\}, \quad (14a)$$

The Gain Solvers 106 determine frequency- and time-varying gains, which, when applied to the original excitation, result in a specific loudness that, ideally, is equal to the desired target specific loudness. In practice, the Gain Solvers determine frequency- and time-varying gains, which when applied to the frequency-domain version of the audio signal results in modifying the audio signal in order to reduce the difference between its specific loudness and the target specific loudness. Ideally, the modification is such that the modified audio signal has a specific loudness that is a close approximation of the target specific loudness. The solution to Eqn. 14a may be implemented in a variety of ways. For example, if a closed form mathematical expression for the inverse of the specific loudness, represented by $\Psi^{-1}\{\bullet\}$, exists, then the gains may be computed directly by re-arranging equation 14a:

$$G[b,t]=\sqrt{\frac{\Psi^{-1}(\hat{N}[b,t])}{\bar{E}[b,t]}} \quad (14b)$$

Alternatively, if a closed form solution for $\Psi^{-1}\{\bullet\}$ does not exist, an iterative approach may be employed in which for each iteration equation 14a is evaluated using a current estimate of the gains. The resulting specific loudness is compared with the desired target and the gains are updated based on the error. If the gains are updated properly, they will converge to the desired solution. Another method involves pre-computing the function $\Psi\{\bullet\}$ for a range of excitation values in each band to create a look-up table. From this look-up table, one obtains an approximation of the inverse function $\Psi^{-1}\{\bullet\}$ and the gains may then be computed from equation 14b. As mentioned earlier, the target specific loudness may be represented by a scaling of the specific loudness:

$$\hat{N}[b,t]=\Xi[b,t]N[b,t] \quad (14c)$$

Substituting equation 13 into 14c and then 14c into 14b yields an alternative expression for the gains:

$$G[b,t]=\sqrt{\frac{\Psi^{-1}(\Xi[b,t]\Psi(\bar{E}[b,t]))}{\bar{E}[b,t]}} \quad (14d)$$

We see that the gains may be expressed purely as a function of the excitation $\bar{E}[b,t]$ and the specific loudness scaling $\Xi[b,t]$. Therefore, the gains may be computed through evaluation of 14d or an equivalent lookup table without ever explicitly computing the specific loudness or target specific loudness as intermediate values. However, these values are implicitly computed through use of equation 14d. Other equivalent methods for computing the modification parameters through either explicit or implicit computation of the specific loudness and target specific loudness may be devised, and this invention is intended to cover all such methods.

Synthesis Filterbank 110

As described above, Analysis Filterbank 100 may be implemented efficiently through use of the Short-time Discrete Fourier Transform (STDFT) or the Modified Discrete Cosine Transform, and the STDFT or MDCT may be used similarly to implement Synthesis Filterbank 110. Specifically, letting $X[k,t]$ represent the STDFT or MDCT of the input audio, as defined earlier, the STDFT or MDCT of the processed (modified) audio in Synthesis Filterbank 110 may be calculated as $$\hat{X}[k,t]=\sum_b G[b,t]S_b[k]X[k,t-d], \quad (15)$$

where $S_b[k]$ is the response of the synthesis filter associated with band b, and d is the delay associated with delay block 109 in FIG. 7. The shape of the synthesis filters $S_b[k]$ may be chosen the same as the filters utilized in the analysis filterbank, $H_b[k]$, or they may be modified to provide perfect reconstruction in the absence of any gain modification (i.e., when $G[b,t]=1$). The final processed audio may then be generated through inverse Fourier or modified cosine transform of $\hat{X}[k,t]$ and overlap-add synthesis, as is familiar to one skilled in the art.

Target Specific Loudness

The behavior of arrangements embodying aspects of the invention such as the examples of FIGS. 1-7 is dictated mainly by the manner in which the target specific loudness $\hat{N}[b,t]$ is calculated. Although the invention is not limited by any particular function or inverse function for calculating target specific loudness, several such functions and suitable applications for them will now be described.

Time-Invariant and Frequency-Invariant Function Suitable for Volume Control

A standard volume control adjusts the loudness of an audio signal by applying a wideband gain to the audio. Generally, the gain is coupled to a knob or slider that is adjusted by a user until the loudness of the audio is at the desired level. An aspect of the present invention allows for a more psychoacoustically consistent way of implementing such a control. According to this aspect of the invention, rather than having a wideband gain coupled to the volume control that results in a change of gain by the same amount across all frequency bands, which may cause a change in the perceived spectrum, a specific loudness scaling factor is associated with the volume control adjustment instead so that the gain in each of multiple frequency bands is changed by an amount that takes into account the human hearing model so that, ideally, there is no change in the perceived spectrum. In the context of this aspect of the invention and an exemplary application thereof, "constant" or "time-invariant" is intended to allow for changes in the setting of a volume control scale factor from time to time, for example, by a user. Such "time-invariance" is sometimes referred to as "quasi time-invariant," "quasi-stationary," "piecewise time-invariant," "piecewise stationary," "step-wise time-invariant," and "step-wise stationary." Given such a scale factor, $\alpha$, the target specific loudness may be calculated as the measured specific loudness multiplied by $\alpha$:

$$\hat{N}[b,t]=\alpha N[b,t]. \tag{16}$$

Figure 13A:
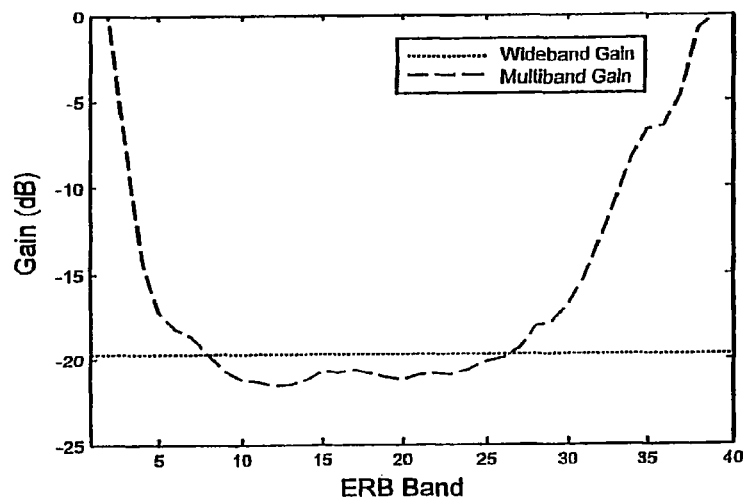
FIG. 13a is an idealized chart showing wideband and multiband gains for loudness scaling of 0.25 on a segment of female speech. The horizontal scale is ERB bands and the vertical scale is relative gain in decibels (dB).

Because total loudness L[t] is the sum of specific loudness N[b,t] across all bands b, the above modification also scales the total loudness by a factor of $\alpha$, but it does so in a way that preserves the same perceived spectrum at a particular time for changes in the volume control adjustment. In other words, at any particular time, a change in the volume control adjustment results in a change in perceived loudness but no change in the perceived spectrum of the modified audio versus the perceived spectrum of the unmodified audio. FIG. 13a depicts the resulting multiband gains G[b,t] across the bands "b" at a particular time "t" when $\alpha=0.25$ for an audio signal consisting of female speech. For comparison, the wideband gain required to scale the original total loudness by 0.25 (the horizontal line), as in a standard volume control, is also plotted. The multiband gain G[b,t] increases at low and high frequency bands in comparison to the middle frequency bands. This is consistent with equal-loudness contours indicating that the human ear is less sensitive at low and high frequencies.

Figure 13B:
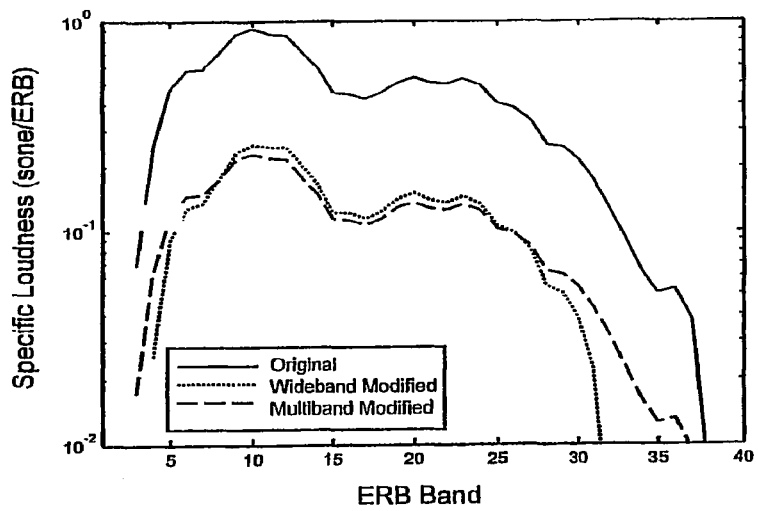
FIG. 13b is an idealized chart showing the specific loudness, respectively, of an original signal, a wideband gain-modified signal, and a multiband gain-modified signal. The horizontal scale is ERB bands and the vertical scale is specific loudness (sone/ERB).

FIG. 13b depicts the specific loudness for the original audio signal, the wideband gain-modified signal as modified in accordance with a prior art volume control, and the multiband gain-modified signal as modified in accordance with this aspect of the invention. The specific loudness of the multiband gain modified signal is that of the original scaled by 0.25. The specific loudness of the wide-band gain modified signal has changed its spectral shape with respect to that of the original unmodified signal. In this case, the specific loudness has, in a relative sense, lost loudness at both the low and the high frequencies. This is perceived as a dulling of the audio as its volume is turned down, a problem that does not occur with the multiband modified signal whose loudness is controlled by gains derived in the perceptual loudness domain.

Along with the distortion of the perceived spectral balance associated with a traditional volume control there exists a second problem. A property of loudness perception, which is reflected in the loudness model reflected in Equations 11a-11d, is that loudness of a signal at any frequency decreases more rapidly as signal level approaches the threshold of hearing. As a result, the electrical attenuation required to impart the same loudness attenuation to a softer signal is less than that required for a louder signal. A traditional volume control imparts a constant attenuation regardless of signal level, and therefore soft signals become "too soft" with respect to louder signals as the volume is turned down. In many cases this results in the loss of detail in the audio. Consider the recording of a castanet in a reverberant room. In such a recording the main "hit" of the castanet is quite loud in comparison to the reverberant echoes, but it is the reverberant echoes that convey the size of the room. As the volume is turned down with a traditional volume control, the reverberant echoes become softer with respect to the main hit and eventually disappear below the threshold of hearing, leaving a "dry" sounding castanet. The loudness based volume control prevents the disappearance of the softer portions of the recordings by boosting the softer reverberant portion of the recording relative to the louder main hit so that the relative loudness between these sections remains constant. In order to achieve this effect, the multiband gains G[b,t] must vary over time at a rate that is commensurate with the human temporal resolution of loudness perception. Because the multiband gains G[b,t] are computed as a function of the smoothed excitation E[b,t], selection of the time constants $\lambda_b$ in Eqn. 8 dictates how quickly the gains may vary across time in each band b. As mentioned earlier, these time constants may be selected to be proportionate the integration time of human loudness perception within band b and thus yield the appropriate variation of G[b,t] over time. It should be noted that if the time constants are chosen inappropriately (either too fast or too slow), then perceptually objectionable artifacts may be introduced in the processed audio.

Time-Invariant and Frequency-Variant Function Suitable for Fixed Equalization

In some applications, one may wish to apply a fixed perceptual equalization to the audio, in which case the target specific loudness may be computed by applying a time-invariant but frequency-variant scale factor $\Theta[b]$ as in the relationship $$\hat{N}[b,t]=\Theta[b]N[b,t],$$

wherein $\hat{N}[b,t]$ is the target specific loudness, N[b,t] is the specific loudness of the audio signal, b is a measure of frequency, and t is a measure of time. In this case, the scaling may vary from band to band. Such an application may be useful for emphasizing, for example, the portion of the spectrum dominated by speech frequencies in order to boost intelligibility.

Frequency-Invariant and Time-Variant Function Suitable for Automatic Gain and Dynamic Range Control The techniques of automatic gain and dynamic range control (AGC and DRC) are well known in the audio processing field. In an abstract sense, both techniques measure the level of an audio signal in some manner and then gain-modify the signal by an amount that is a function of the measured level. For the case of AGC, the signal is gain-modified so that its measured level is closer to a user selected reference level. With DRC, the signal is gain-modified so that the range of the signal's measured level is transformed into some desired range. For example, one may wish to make the quiet portions of the audio louder and the loud portions quieter. Such a system is described by Robinson and Gundry (Charles Robinson and Kenneth Gundry, "Dynamic Range Control via Metadata," 107th Convention of the AES, Preprint 5028, Sep. 24-27, 1999, New York). Traditional implementations of AGC and DRC generally utilize a simple measurement of audio signal level, such as smoothed peak or root mean square (rms) amplitude, to drive the gain modification. Such simple measurements correlate to some degree to the perceived loudness of the audio, but aspects of the present invention allow for more perceptually relevant AGC and DRC by driving the gain modifications with a measure of loudness based on a psychoacoustic model. Also, many traditional AGC and DRC systems apply the gain modification with a wideband gain, thereby incurring the aforementioned timbral (spectral) distortions in the processed audio.

Aspects of the present invention, on the other hand, utilize a multiband gain to shape the specific loudness in a manner that reduces or minimizes such distortions.

Both the AGC and DRC applications employing aspects of the present invention are characterized by a function that transforms or maps an input wideband loudness $L_i[t]$ into a desired output wideband loudness $L_o[t]$, where the loudness is measured in perceptual loudness units, such as sone. The input wideband loudness $L_i[t]$ is a function of the input audio signal's specific loudness $N[b,t]$. Although it may be the same as the input audio signal's total loudness, it may be a temporally-smoothed version of the audio signal's total loudness.

Figure 14A:
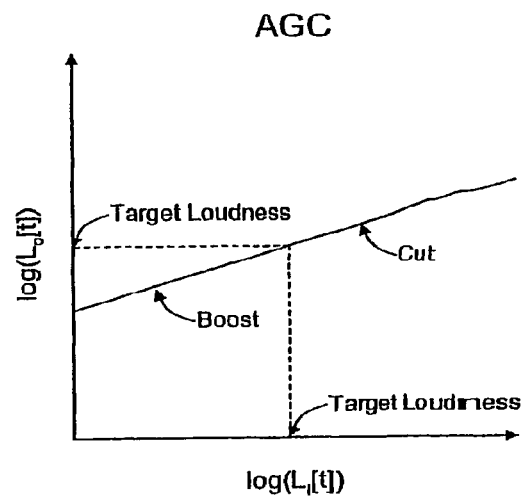
FIG. 14a is an idealized chart showing: $L_o[t]$ as a function of $L_i[t]$ for typical AGC. The horizontal scale is $\log(L_i[t])$ and the vertical scale is $\log(L_o[t])$.
Figure 14B:
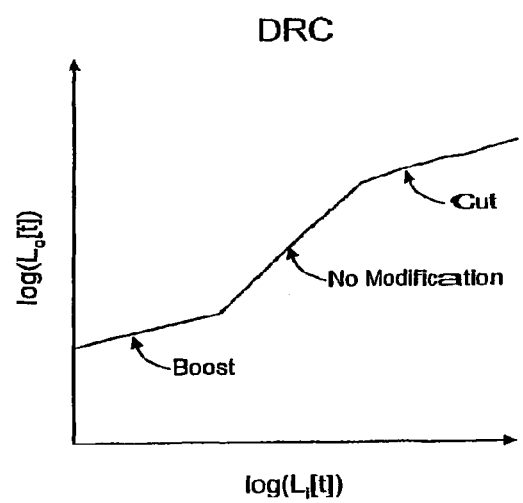
FIG. 14b is an idealized chart showing: $L_o[t]$ as a function of $L_i[t]$ for typical DRC. The horizontal scale is $\log(L_i[t])$ and the vertical scale is $\log(L_o[t])$.

FIGS. 14a and 14b depict examples of mapping functions typical for an AGC and a DRC, respectively. Given such a mapping in which $L_o[t]$ is a function of $L_i[t]$, the target specific loudness may be calculated as $$\hat{N}[b, t] = \frac{L_o[t]}{L_i[t]} N[b, t]. \tag{17}$$

The audio signal's original specific loudness $N[b,t]$ is simply scaled by the ratio of the desired output wideband loudness to the input wideband loudness to yield an output specific loudness $\hat{N}[b,t]$. For an AGC system, the input wideband loudness $L_i[t]$ should generally be a measure of the long-term total loudness of the audio. This can be achieved by smoothing the total loudness $L[t]$ across time to generate $L_i[t]$.

In comparison to an AGC, a DRC system reacts to shorter term changes in a signal's loudness, and therefore $L_i[t]$ can simply be made equal to $L[t]$. As a result, the scaling of specific loudness, given by $L_o[t]/L_i[t]$, may fluctuate rapidly leading to unwanted artifacts in the processed audio. One typical artifact is the audible modulation of a portion of the frequency spectrum by some other relatively unrelated portion of the spectrum. For example, a classical music selection might contain high frequencies dominated by a sustained string note, while the low frequencies contain a loud booming timpani. Whenever the timpani hits, the overall loudness $L_i[t]$ increases, and the DRC system applies attenuation to the entire specific loudness. The strings are then heard to "pump" down and up in loudness with the timpani. Such cross pumping in the spectrum is a problem with traditional wideband DRC systems as well, and a typical solution involves applying DRC independently to different frequency bands. The system disclosed here is inherently multiband due to the filterbank and the calculation of specific loudness that employs a perceptual loudness model, and therefore modifying a DRC system to operate in a multiband fashion in accordance with aspects of the present invention is relatively straightforward and is next described.

Frequency-Variant and Time-Variant Function Suitable for Dynamic Range Control

The DRC system may be expanded to operate in a multi-band or frequency-variant fashion by allowing the input and output loudness to vary independently with band b. These multiband loudness values are referenced as $L_i[b,t]$ and $L_o[b,t]$, and the target specific loudness may then be given by $$\hat{N}[b, t] = \frac{L_o[b, t]}{L_i[b, t]} N[b, t], \tag{18}$$

where $L_o[b,t]$ has been calculated from or mapped from $L_i[b,t]$, as illustrated in FIG. 14b, but independently for each band b. The input multiband loudness $L_i[b,t]$ is a function of the input audio signal's specific loudness $N[b,t]$. Although it may be the same as the input audio signal's specific loudness, it may be a temporally-smoothed and/or frequency-smoothed version of the audio signal's specific loudness.

Figure 15:
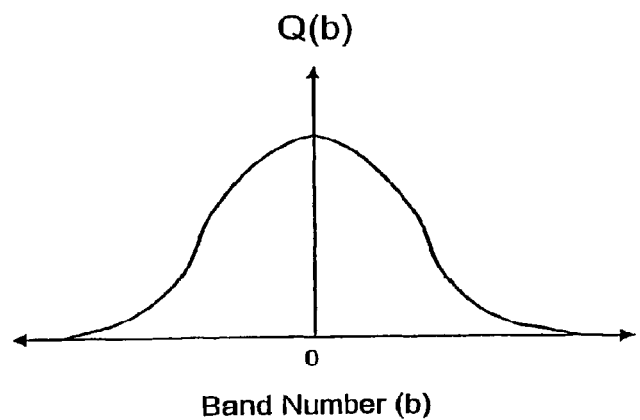
FIG. 15 is an idealized chart showing a typical band-smoothing function for multiband DRC. The horizontal scale is band number and the vertical scale is the gain output for the band b.

The most straightforward way of calculating $L_i[b,t]$ is to set it equal to the specific loudness $N[b,t]$. In this case, DRC is performed independently on every band in the auditory filterbank of the perceptual loudness model rather than in accordance with the same input versus output loudness ratio for all bands as just described above under the heading "Frequency-Invariant and Time-Variant Function Suitable for Automatic Gain and Dynamic Range Control." In a practical embodiment employing 40 bands, the spacing of these bands along the frequency axis is relatively fine in order to provide an accurate measure of loudness. However, applying a DRC scale factor independently to each band may cause the processed audio to sound "torn apart". To avoid this problem, one may choose to calculate $L_i[b,t]$ by smoothing specific loudness $N[b,t]$ across bands so that the amount of DRC applied from one band to the next does not vary as drastically. This may be achieved by defining a band-smoothing filter $Q(b)$ and then smoothing the specific loudness across all bands c according to the standard convolution $$L_i[b, t] = \sum_c Q(b - c) N[c, t]. \tag{19}$$

wherein $N[c,t]$ is the specific loudness of the audio signal and $Q(b-c)$ is the band-shifted response of the smoothing filter. FIG. 15 depicts one example of such a band-smoothing filter.

If the DRC function that calculates $L_i[b,t]$ as a function of $L_o[b,t]$ is fixed for every band b, then the type of change incurred to each band of the specific loudness $N[b,t]$ will vary depending on the spectrum of the audio being processed, even if the overall loudness of the signal remains the same. For example, an audio signal with loud bass and quiet treble may have the bass cut and the treble boosted. A signal with quiet bass and loud treble may have the opposite occur. The net effect is a change in the timbre or perceived spectrum of the audio, and this may be desirable in certain applications.

However, one may wish to perform multiband DRC without modifying the average perceived spectrum of the audio. One might want the average modification in each band to be roughly the same while still allowing the short-term variations of the modifications to operate independently between and among bands. The desired effect may be achieved by forcing the average behavior of the DRC in each band to be the same as that of some reference behavior. One may choose this reference behavior as the desired DRC for the wideband input loudness $L_i[t]$. Let the function $L_o[t]=DRC\{L_i[t]\}$ represent the desired DRC mapping for the wideband loudness. Then let $\bar{L}_i[t]$ represent a time-averaged version of the wideband input loudness, and let $\bar{L}_i[b,t]$ represent a time-averaged version of the multiband input loudness $L_i[b,t]$. The multiband output loudness may then be calculated as $$L_o[b, t] = \frac{\overline{L}_i[b, t]}{\overline{L}_i[t]} DRC\left\{\frac{\overline{L}_i[t]}{\overline{L}_i[b, t]} L_i[b, t]\right\}. \quad (20)$$

Note that the multiband input loudness is first scaled to be in the same average range as the wideband input loudness. The DRC function designed for the wideband loudness is then applied. Lastly, the result is scaled back down to the average range of the multiband loudness. With this formulation of multiband DRC, the benefits of reduced spectral pumping are retained, while at the same time preserving the average perceived spectrum of the audio.

Frequency-Variant and Time-Variant Function Suitable for Dynamic Equalization Another application of aspects of the present invention is the intentional transformation of the audio's time-varying perceived spectrum to a target time-invariant perceived spectrum while still preserving the original dynamic range of the audio. One may refer to this processing as Dynamic Equalization (DEQ). With traditional static equalization, a simple fixed filtering is applied to the audio in order to change its spectrum. For example, one might apply a fixed bass or treble boost. Such processing does not take into account the current spectrum of the audio and may therefore be inappropriate for some signals, i.e., signals that already contain a relatively large amount of bass or treble. With DEQ, the spectrum of the signal is measured and the signal is then dynamically modified in order to transform the measured spectrum into an essentially static desired shape. For aspects of the present invention, such a desired shape is specified across bands in the filterbank and referred to as EQ[b]. In a practical embodiment, the measured spectrum should represent the average spectral shape of the audio that may be generated by smoothing the specific loudness N[b,t] across time. One may refer to the smoothed specific loudness as $\overline{N}$[b,t]. As with the multiband DRC, one may not want the DEQ modification to vary drastically from one band to the next, and therefore a band-smoothing function may be applied to generate a band-smoothed spectrum $\overline{L}$[b,t]:

$$\overline{L}[b, t] = \sum_c Q(b - c)\overline{N}[c, t]. \quad (21)$$

In order to preserve the original dynamic range of the audio, the desired spectrum EQ[b] should be normalized to have the same overall loudness as the measured spectral shape given by $\overline{L}$[b,t]. One may refer to this normalized spectral shape as $\overline{L}_{EQ}$[b,t]:

$$\overline{L}_{EQ}[b, t] = \left(\frac{\sum_c \overline{L}[c, t]}{\sum_c EQ[c]}\right) EQ[b]. \quad (22)$$

Finally, the target specific loudness is calculated as $$\hat{N}[b, t] = \left(\frac{\overline{L}[b, t]}{\overline{L}_{EQ}[b, t]}\right)^{1-\beta} \frac{\overline{L}_{EQ}[b, t]}{\overline{L}[b, t]} N[b, t], \quad (23)$$

where β is a user-specified parameter ranging from zero to one, indicating the degree of DEQ that is to be applied. Looking at Eqn. 23, one notes that when β=0, the original specific loudness is unmodified, and when β=1, the specific loudness is scaled by the ratio of the desired spectral shape to the measured spectral shape.

Figure 16:
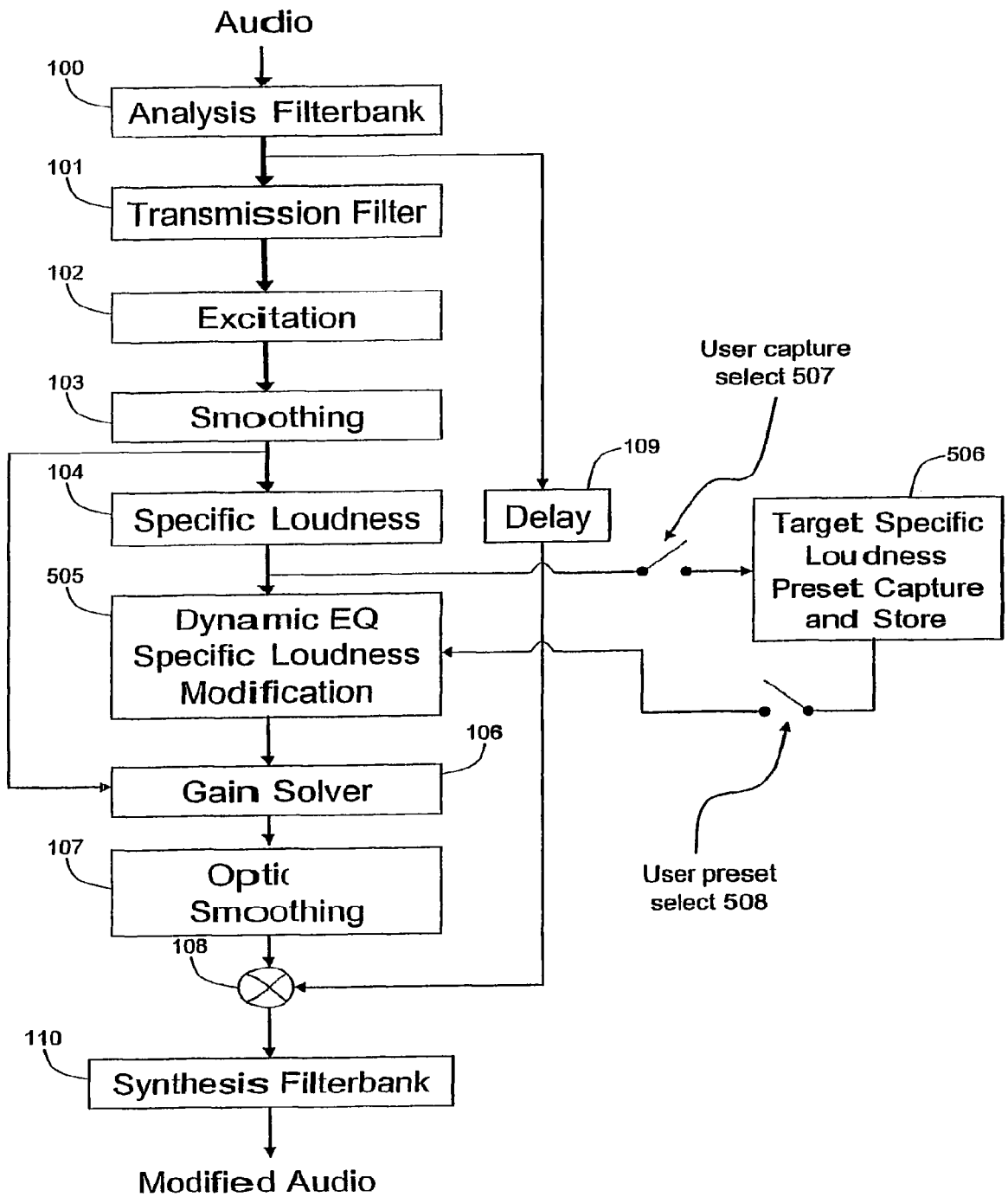
FIG. 16 is a schematic functional block diagram or schematic flow chart showing an overview of an aspect of the present invention.

One convenient way of generating the desired spectral shape EQ[b] is for a user to set it equal to $\overline{L}$[b,t] as measured for some piece of audio whose spectral balance the user finds pleasing. In a practical embodiment, for example as shown in FIG. 16, the user may be provided a button or other suitable actuator 507 that, when actuated, causes a capture of the current measure of the audio's spectral shape $\overline{L}$[b,t], and then stores this measure as a preset (in Target Specific Loudness Preset Capture and Store 506) that may later be loaded into EQ[b] when DEQ is enabled (as by preset select 508). FIG. 16 is a simplified version of FIG. 7 in which only a single line is shown to represent multiple bands from Analysis Filterbank 100 to Synthesis Filterbank 110. The FIG. 17 example also provides a Dynamic EQ Specific Loudness (SL) Modification 505 that provides a modification to the specific loudness measured by function or device 104 in accordance with dynamic equalization, as explained above.

Combined Processing

One may wish to combine all the previously described processing, including Volume Control (VC), AGC, DRC, and DEQ, into a single system. Because each of these processes may be represented as a scaling of the specific loudness, all of them are easily combined as follows:

$$\hat{N}[b,t]=(\Xi_{VC}[b,t]\Xi_{AGC}[b,t]\Xi_{DRC}[b,t]\Xi_{DEQ}[b,t])N[b,t], \quad (24)$$

where $\Xi_*[b,t]$ represents the scale factors associated with process "*". A single set of gains G[b,t] may then be calculated for the target specific loudness that represents the combined processing.

In some cases, the scale factors of one or a combination of the loudness modification processes may fluctuate too rapidly over time and produce artifacts in the resulting processed audio. It may therefore be desirable to smooth some subset of these scaling factors. In general, the scale factors from VC and DEQ varying smoothly over time, but smoothing the combination of the AGC and DRC scale factors may be required. Let the combination of these scale factors be represented by $$\Xi_C[b,t]=\Xi_{AGC}[b,t]\Xi_{DRC}[b,t] \quad (25)$$

The basic notion behind the smoothing is that the combined scale factors should react quickly when the specific loudness is increasing, and that the scale factors should be more heavily smoothed when the specific loudness is decreasing. This notion corresponds to the well-known practice of utilizing a fast attack and a slow release in the design of audio compressors. The appropriate time constants for smoothing the scale factors may be calculated by smoothing across time a band-smoothed version of the specific loudness. First a band-smoothed version of the specific loudness is computed:

$$L[b, t] = \sum_c Q(b - c)N[c, t]. \quad (26)$$

wherein N[c, t] is the specific loudness of the audio signal and Q(b−c) is the band-shifted response of the smoothing filter as in Eqn. 19, above.

The time-smoothed version of this band-smoothed specific loudness is then calculated as $$\overline{L}[b,t] = \lambda[b,t] L[b,t] + (1-\lambda[b,t])\overline{L}[b,t-1] \quad (27)$$

where the band dependent smoothing coefficient $\lambda[b,t]$ is given by $$\lambda[b,t] = \begin{cases} \lambda_{fast}, & L[b,t] > \overline{L}[b,t] \\ \lambda_{slow} & L[b,t] \le \overline{L}[b,t]. \end{cases} \quad (28)$$

The smoothed combined scale factors are then calculated as $$\overline{\Xi}_C[b,t] = \lambda_M[b,t]\Xi_C[b,t] + (1-\lambda_M[b,t])\overline{\Xi}_C[b,t-1], \quad (29)$$

where $\lambda_M[b,t]$ is a band-smoothed version of $\lambda[b,t]$:

$$\lambda_M[b,t] = \left(\frac{1}{\sum_c Q(c)}\right) \sum_c Q(b-c)\lambda[b,t]. \quad (30)$$

Band smoothing of the smoothing coefficient prevents the time-smoothed scale factors from changing drastically across bands. The described scale factor time- and band-smoothing results in processed audio containing fewer objectionable perceptual artifacts.

Noise Compensation

In many audio playback environments there exists background noise that interferes with the audio that a listener wishes to hear. For example, a listener in a moving automobile may be playing music over the installed stereo system and noise from the engine and road may significantly alter the perception of the music. In particular, for parts of the spectrum in which the energy of the noise is significant relative to the energy of the music, the perceived loudness of the music is reduced. If the level of the noise is large enough, the music is completely masked. With respect to an aspect of the current invention, one would like to choose gains $G[b,t]$ so that the specific loudness of the processed audio in the presence of the interfering noise is equal to the target specific loudness $\hat{N}S[b,t]$. To achieve this effect, one may utilize the concept of partial loudness, as defined by Moore and Glasberg, supra. Assume that one is able to obtain a measurement of the noise by itself and a measurement of the audio by itself. Let $E_N[b,t]$ represent the excitation from the noise and let $E_A[b,t]$ represent the excitation from the audio. The combined specific loudness of the audio and the noise is then given by $$N_{TOT}[b,t] = \Psi\{E_A[b,t] + E_N[b,t]\}, \quad (31)$$

where, again, $\Psi\{\cdot\}$ represents the non-linear transformation from excitation to specific loudness. One may assume that a listener's hearing partitions the combined specific loudness between the partial specific loudness of the audio and the partial specific loudness of the noise in a way that preserves the combined specific loudness:

$$N_{TOT}[b,t] = N_A[b,t] + N_N[b,t]. \quad (32)$$

The partial specific loudness of the audio, $N_A[b,t]$, is the value one wishes to control, and therefore one must solve for this value. The partial specific loudness of the noise may be approximated as $$N_N[b,t] = \left(\frac{E_{TN}[b,t]}{E_A[b,t]}\right)^\kappa (\Psi\{E_N[b,t] + E_{TN}[b,t]\} - \Psi\{E_{TQ}[b]\}) \quad (33)$$

where $E_{TN}[b,t]$ is the masked threshold in the presence of the noise, $E_{TQ}[b]$ is the threshold of hearing in quiet at band b, and $\kappa$ is an exponent between zero and one. Combining Eqns. 31-33 one arrives at an expression for the partial specific loudness of the audio:

$$N_A[b,t] = \Psi\{E_A[b,t] + E_N[b,t]\} - \quad (34)$$

$$\left(\frac{E_{TN}[b,t]}{E_A[b,t]}\right)^\kappa (\Psi\{E_N[b,t] + E_{TN}[b,t]\} - \Psi\{E_{TQ}[b]\})$$

One notes that when the excitation of the audio is equal to the masked threshold of the noise ($E_A[b,t]=E_{TN}[b,t]$), the partial specific loudness of the audio is equal to the loudness of a signal at the threshold in quiet, which is the desired outcome. When the excitation of the audio is much greater than that of the noise, the second term in Eqn. 34 vanishes, and the specific loudness of the audio is approximately equal to what it would be if the noise were not present. In other words, as the audio becomes much louder than the noise, the noise is masked by the audio. The exponent $\kappa$ is chosen empirically to give a good fit to data on the loudness of a tone in noise as a function of the signal-to-noise ratio. Moore and Glasberg have found that a value of $\kappa=0.3$ is appropriate. The masked threshold of the noise may be approximated as a function of the noise excitation itself:

$$E_{TN}[b,t] = K[b]E_N[b,t] + E_{TQ}[b] \quad (35)$$

where $K[b]$ is a constant that increases at lower frequency bands. Thus, the partial specific loudness of the audio given by Eqn. 34 may be represented abstractly as a function of the excitation of the audio and the excitation of the noise:

$$N_A[b,t] = \Phi\{E_A[b,t], E_N[b,t]\}. \quad (36)$$

A modified gain solver may then be utilized to calculate the gains $G[b,t]$ such that the partial specific loudness of the processed audio in the presence of the noise is equal to the target specific loudness:

$$\hat{N}[b,t] = \Phi\{G^2[b,t]E_A[b,t], E_N[b,t]\} \quad (37)$$

Figure 17:
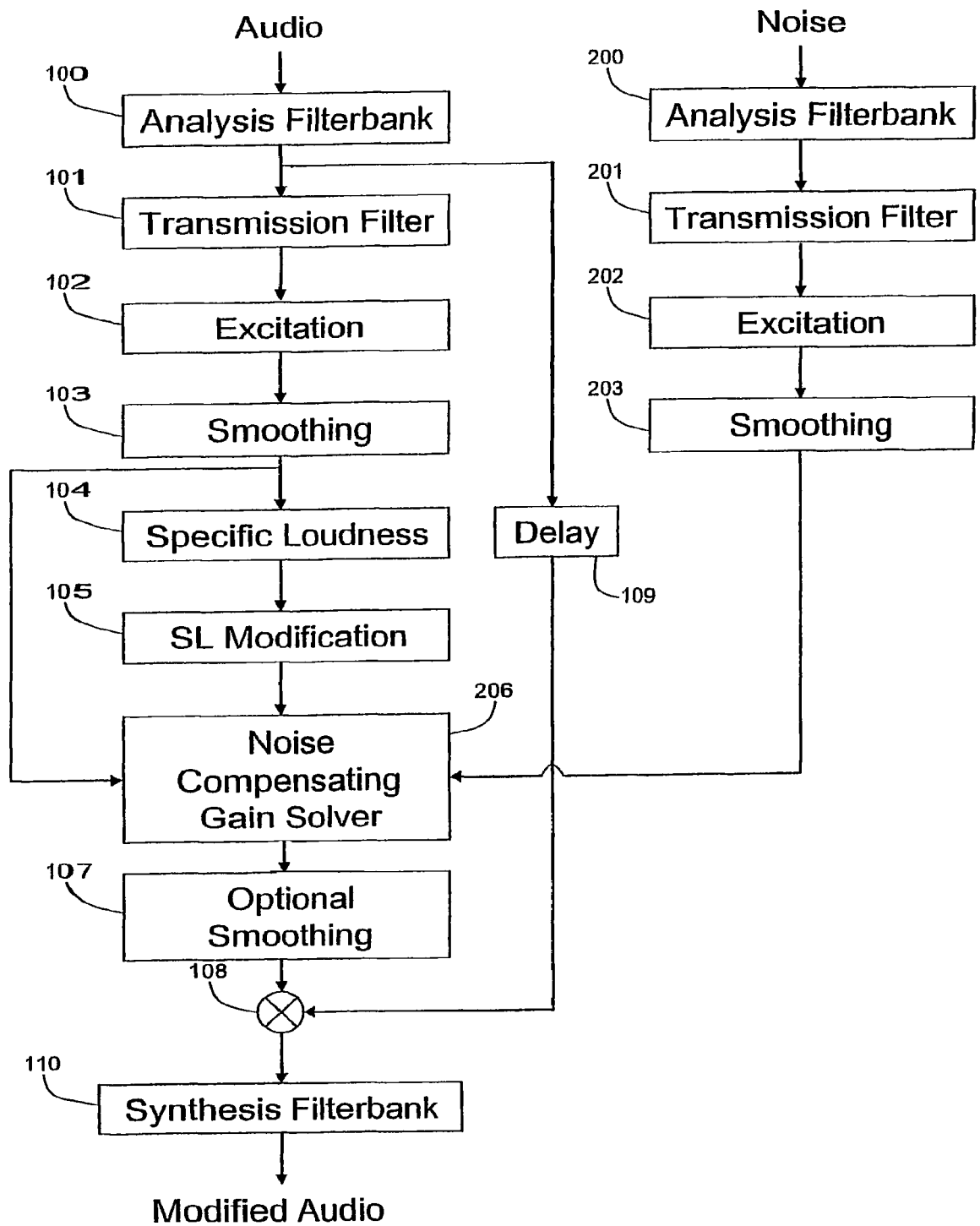
FIG. 17 is a schematic functional block diagram or schematic flow chart similar to FIG. 1 that also includes compensation for noise in a playback environment.

FIG. 17 depicts the system of FIG. 7 with the original Gain Solver 106 replaced by the described Noise Compensating Gain Solver 206 (note that the multiple vertical lines between blocks representing the multiple bands of the filterbank have been replaced by a single line to simplify the diagram). In addition, the figure depicts the measurement of the noise excitation (by Analysis Filterbank 200, Transmission Filter 201, Excitation 202 and Smoothing 203 in a manner corresponding to the operation of blocks 100, 101, 102 and 103) that feeds into the new gain solver 206 along with the excitation of the audio (from Smoothing 103) and the target specific loudness (from SL Modification 105).

In its most basic mode of operation, the SL Modification 105 in FIG. 17 may simply set the target specific loudness $\hat{N}[b,t]$ equal to the original specific loudness of the audio $N[b,t]$. In other words, the SL Modification provides a frequency-invariant, scale factor $\alpha$ scaling of the specific loudness of the audio signal, wherein $\alpha=1$. With an arrangement such as in FIG. 17, the gains are calculated so that the perceived loudness spectrum of the processed audio in the presence of the noise is equal to the loudness spectrum of the audio in the absence of the noise. Additionally, any one or combination of ones of the previously described techniques for computing the target specific loudness as a function of the original, including VC, AGC, DRC, and DEQ, may be utilized in conjunction with the noise compensating loudness modification system.

In a practical embodiment, the measurement of the noise may be obtained from a microphone placed in or near the environment into which the audio will be played. Alternatively, a predetermined set of template noise excitations may be utilized that approximate the anticipated noise spectrum under various conditions. For example, the noise in an automobile cabin may be pre-analyzed at various driving speeds and then stored as a look-up table of noise excitation versus speed. The noise excitation fed into the Gain Solver 206 in FIG. 17 may then be approximated from this look-up table as the speed of the automobile varies.

Implementation

The invention may be implemented in hardware or software, or a combination of both (e.g., programmable logic arrays). Unless otherwise specified, the algorithms included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and nonvolatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described herein may be order independent, and thus can be performed in an order different from that described.

The invention claimed is:

1. A method for controlling a perceptual loudness of a digital audio signal, comprising:
deriving modification parameters from the digital audio signal for modifying reproduction of the digital audio signal to reduce a difference between the perceptual loudness and a target loudness, the modification parameters comprising amplitude scale factors, each amplitude scale factor respectively operating in a frequency band of a plurality of frequency bands;
applying the modification parameters to the digital audio signal to reduce the difference between the perceptual loudness and the target loudness,
wherein the perceptual loudness varies both with frequency and acoustic level;
wherein the method is performed by one or more computing devices.

2. The method of claim 1, further comprising:
time smoothing the amplitude scale factors.

3. The method of claim 1, further comprising:
band smoothing of the amplitude scale factors.

4. The method of claim 1, wherein the plurality of frequency bands are derived from a filter bank.

5. The method of claim 1, wherein the digital audio signal is a discrete time sequence.

6. The method of claim 1, wherein applying the modification parameter is configured to be selectable by a user.

7. An apparatus for controlling a perceptual loudness of a digital audio signal, comprising:
a subsystem, implemented at least partially in hardware that derives modification parameters from the digital audio signal for modifying reproduction of the digital audio signal to reduce a difference between the perceptual loudness and a target loudness, the modification parameters comprising amplitude scale factors, each amplitude scale factor respectively operating in a frequency band of a plurality of frequency bands;
a subsystem, implemented at least partially in hardware that applies the modification parameters to the digital audio signal to reduce the difference between the perceptual loudness and the target loudness,
wherein the perceptual loudness varies both with frequency and acoustic level.

8. The apparatus of claim 7, further comprising:
a subsystem, implemented at least partially in hardware that time smoothens amplitude scale factors.

9. The apparatus of claim 7, further comprising:
a subsystem, implemented at least partially in hardware that band smoothens the amplitude scale factors.

10. The apparatus of claim 7, wherein the plurality of frequency bands are derived from a filter bank.

11. The apparatus of claim 7, wherein the digital audio signal is a discrete time sequence.

12. The apparatus of claim 7, wherein the application of the modification parameter is configured to be selectable by a user.

13. A non-transitory computer readable medium, storing software instructions for controlling a perceptual loudness of a digital audio signal, which when executed by one or more processors cause performance of the steps of:
deriving modification parameters from the digital audio signal for modifying reproduction of the digital audio signal to reduce a difference between the perceptual loudness and a target loudness, the modification parameters comprising amplitude scale factors, each amplitude scale factor respectively operating in a frequency band of a plurality of frequency bands;
applying the modification parameters to the digital audio signal to reduce the difference between the perceptual loudness and the target loudness,
wherein the perceptual loudness varies both with frequency and acoustic level.

14. The non-transitory computer readable medium of claim 13, further comprising:
time smoothing the amplitude scale factors.

15. The non-transitory computer readable medium of claim 13, further comprising:
band smoothing of the amplitude scale factors.

16. The non-transitory computer readable medium of claim 13, wherein the plurality of frequency bands are derived from a filter bank.

17. The non-transitory computer readable medium of claim 13, wherein the digital audio signal is a discrete time sequence.

18. The non-transitory computer readable medium of claim 13, wherein applying the modification parameter is configured to be selectable by a user.

* * * * *